(12) United States Patent
Park et al.

(10) Patent No.: US 12,193,306 B2
(45) Date of Patent: Jan. 7, 2025

(54) DISPLAY DEVICE INCLUDING SIGNAL LINES

(71) Applicant: Samsung Display Co., Ltd., Yongin-Si (KR)

(72) Inventors: Sanghun Park, Cheonan-si (KR); Jihoon Kim, Suwon-si (KR); Yongsub So, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 427 days.

(21) Appl. No.: 17/582,311

(22) Filed: Jan. 24, 2022

(65) Prior Publication Data
US 2022/0285449 A1 Sep. 8, 2022

(30) Foreign Application Priority Data
Mar. 4, 2021 (KR) ................. 10-2021-0028761

(51) Int. Cl.
*H10K 59/40* (2023.01)
*G06F 3/041* (2006.01)
*G06F 3/044* (2006.01)
*H10K 50/844* (2023.01)
*H10K 59/131* (2023.01)

(52) U.S. Cl.
CPC ........... *H10K 59/40* (2023.02); *G06F 3/0412* (2013.01); *G06F 3/0443* (2019.05); *H10K 50/844* (2023.02); *H10K 59/131* (2023.02)

(58) Field of Classification Search
CPC .... H10K 59/40; H10K 50/844; H10K 59/131; G06F 3/0412; G06F 3/0443; G06F 3/04164
USPC ......................................................... 257/91
See application file for complete search history.

(56) References Cited

U.S. PATENT DOCUMENTS

| | | | |
|---|---|---|---|
| 9,971,438 B2 * | 5/2018 | Ono | G06F 3/0445 |
| 10,903,285 B2 | 1/2021 | Kim et al. | |
| 2011/0090170 A1 * | 4/2011 | Lin | G06F 3/0446 |
| | | | 345/174 |
| 2014/0252322 A1 * | 9/2014 | Kim | H10K 59/40 |
| | | | 257/40 |
| 2018/0033834 A1 * | 2/2018 | Jun | H10K 59/8731 |
| 2019/0034010 A1 * | 1/2019 | Lee | G06F 3/0443 |

(Continued)

FOREIGN PATENT DOCUMENTS

KR 10-2019-0038719 4/2019

*Primary Examiner* — Nduka E Ojeh
*Assistant Examiner* — Laura M Dykes
(74) *Attorney, Agent, or Firm* — F. CHAU & ASSOCIATES, LLC

(57) ABSTRACT

A display device includes a display panel configured to display an image. The display panel includes an electrode layer. An input sensing layer is disposed on the display panel. The input sensing layer includes a plurality of sensing electrodes including a first sensing electrode and a second sensing electrode. A plurality of signal lines is electrically connected to the plurality of sensing electrodes. The plurality of signal lines includes a first signal line electrically connected to the first sensing electrode and a second signal line electrically connected to the second sensing electrode. The first signal line has a length different from a length of the second signal line. A distance between the first signal line and the electrode layer is different from a distance between the second signal line and the electrode layer.

21 Claims, 11 Drawing Sheets

(56) References Cited

U.S. PATENT DOCUMENTS

2019/0103443 A1\* 4/2019 Kim ................. H10K 59/40
2021/0191550 A1\* 6/2021 Wang ................ G06F 3/0446

\* cited by examiner

DISPLAY DEVICE INCLUDING SIGNAL LINES

CROSS-REFERENCE TO RELATED APPLICATION

This application claims priority under 35 U.S.C. § 119 to Korean Patent Application No. 10-2021-0028761, filed on Mar. 4, 2021 in the Korean Intellectual Property Office, the disclosure of which is incorporated by reference in its entirety herein.

TECHNICAL FIELD

The present inventive concept relates to a display device. More particularly, the present inventive concept relates to a display device having an input sensing function.

DISCUSSION OF RELATED ART

A variety of multimedia electronic devices include a display device to display images, such as televisions, mobile phones, tablet computers, navigation units, and game units. The multimedia electronic devices may include an input sensor that provides a touch-based input method so that users may easily and intuitively input information or commands in addition to traditional input methods, such as a button, a keyboard, a mouse, etc.

The input sensor is included in the display device to sense a position at which a touch event occurs, such as by a part of a user's body.

SUMMARY

The present inventive concept provides a display device that reduces a difference in capacitance between signal lines included in an input sensing layer and an electrode layer included in a display panel.

According to an embodiment of the present inventive concept, a display device includes a display panel configured to display an image. The display panel includes an electrode layer. An input sensing layer is disposed on the display panel. The input sensing layer includes a plurality of sensing electrodes including a first sensing electrode and a second sensing electrode. A plurality of signal lines is electrically connected to the plurality of sensing electrodes. The plurality of signal lines includes a first signal line electrically connected to the first sensing electrode and a second signal line electrically connected to the second sensing electrode. The first signal line has a length different from a length of the second signal line. A distance between the first signal line and the electrode layer is different from a distance between the second signal line and the electrode layer.

In an embodiment, the length of the first signal line is longer than the length of the second signal line. The distance between the first signal line and the electrode layer is greater than the distance between the second signal line and the electrode layer.

In an embodiment, the first signal line has a width greater than a width of the second signal line.

In an embodiment, the first sensing electrode and the second sensing electrode are spaced apart from each other in a first direction. The first signal line includes a first line portion extending in the first direction and a second line portion extending in a second direction crossing the first direction. The second signal line includes a third line portion extending in the first direction and a fourth line portion extending in the second direction.

In an embodiment, the first line portion has a length longer than a length of the third line portion, and a distance between the first line portion and the electrode layer is greater than a distance between the third line portion and the electrode layer.

In an embodiment, the display panel includes a display element layer including a light emitting element and an encapsulation layer disposed on the display element layer. The light emitting element includes a first electrode, a light emitting layer disposed on the first electrode, and a second electrode disposed on the light emitting layer.

In an embodiment, the electrode layer includes the second electrode, and a distance between the first signal line and the second electrode is different from a distance between the second signal line and the second electrode.

In an embodiment, the first signal line has the length longer than the length of the second signal line. The distance between the first signal line and the second electrode is greater than the distance between the second signal line and the second electrode.

In an embodiment, a first encapsulation portion of the encapsulation layer, which corresponds to the first signal line, has a thickness different from a thickness of the second encapsulation portion of the encapsulation layer, which corresponds to the second signal line.

In an embodiment, the first signal line has the length longer than the length of the second signal line. The thickness of the first encapsulation portion is greater than the thickness of the second encapsulation portion.

In an embodiment, the encapsulation layer includes a first inorganic layer disposed on the display element layer, a second inorganic layer disposed on the first inorganic layer, and an organic layer disposed between the first and second inorganic layers.

In an embodiment, a first organic layer portion of the organic layer, which corresponds to the first signal line, has a thickness greater than a thickness of the second organic layer portion of the organic layer, which corresponds to the second signal line.

In an embodiment, the first sensing electrode and the second sensing electrode are spaced apart from each other in the first direction. The first signal line includes a first line portion extending in the first direction and a second line portion extending in the second direction crossing the first direction. The second signal line includes a third line portion extending in the first direction and a fourth line portion extending in the second direction.

In an embodiment, the first line portion has a length longer than a length of the third line portion, and a thickness of a third encapsulation portion of the encapsulation layer, which corresponds to the first line portion, is greater than a thickness of a fourth encapsulation portion of the encapsulation layer, which corresponds to the third line portion.

In an embodiment, the first signal line has the length longer than the length of the second signal line. The encapsulation layer further includes a first insulating layer disposed on the second inorganic layer and corresponding to the first and second signal lines and a second insulating layer disposed on the first insulating layer and corresponding to the first signal line.

In an embodiment, the input sensing layer includes a sensing insulating layer disposed on the display panel and a conductive layer disposed on the sensing insulating layer and including the sensing electrodes and the signal lines. A first insulating portion of the sensing insulating layer, which corresponds to the first signal line, has a thickness different from a thickness of the second insulating portion of the sensing insulating layer, which corresponds to the second signal line of the sensing insulating layer.

In an embodiment, the first signal line has the length longer than the length of the second signal line. The thickness of the first insulating portion is greater than the thickness of the second insulating portion.

In an embodiment, the first sensing electrode and the second sensing electrode are spaced apart from each other in the first direction. The first signal line includes a first line portion extending in the first direction and a second line portion extending in the second direction crossing the first direction. The second signal line includes a third line portion extending in the first direction and a fourth line portion extending in the second direction.

In an embodiment, the first line portion has a length longer than a length of the third line portion, and a thickness of a third insulating portion of the sensing insulating layer, which corresponds to the first line portion, is greater than a thickness of a fourth insulating portion of the sensing insulating layer, which corresponds to the third line portion.

In an embodiment, the sensing insulating layer includes an organic material.

According to an embodiment of the present inventive concept, a display device includes a display panel configured to display an image. The display panel includes an electrode layer. An input sensing layer is disposed on the display panel and is configured to sense an input. The input sensing layer comprises a plurality of sensing electrodes and a plurality of signal lines electrically connected to the plurality of sensing electrodes, respectively. Each of the plurality of signal lines has a length and a width different from a length and a width of other signal lines of the plurality of signal lines. Each of the plurality of signal lines has a substantially same resistance as each other. Each of the plurality of signal lines has a distance to the electrode layer that is different from other signal lines of the plurality of signal lines. Each of the plurality of signal lines has a substantially same capacitance with the electrode layer.

In an embodiment, the plurality of sensing electrodes includes 1st to n sensing electrodes in which n is a natural number greater than or equal to 2. The plurality of signal lines includes 1st to n signal lines electrically connected to the 1st to n sensing electrodes, respectively. A length and a width of the 1st to n signal lines increase from the 1st signal line to the n signal line. The distance of the 1st to n signal lines to the electrode layer increases from the 1st signal line to the n signal line.

According to the above, the display device prevents a difference in capacitance from occurring between each of the signal lines of the input sensing layer and the electrode layer of the display panel. For example, when the signal lines have different lengths or different widths from each other, the difference in capacitance between each of the signal lines and the electrode layer is reduced or removed by adjusting the distance between each of the signal lines and the electrode layer. Thus, a deterioration in sensing sensitivity of the input sensing layer, which is caused by the difference in capacitance, is prevented.

BRIEF DESCRIPTION OF THE DRAWINGS

The above and other advantages of the present inventive concept will become readily apparent by reference to the following detailed description when considered in conjunction with the accompanying drawings wherein.

DETAILED DESCRIPTION OF EMBODIMENTS

Figure 1:
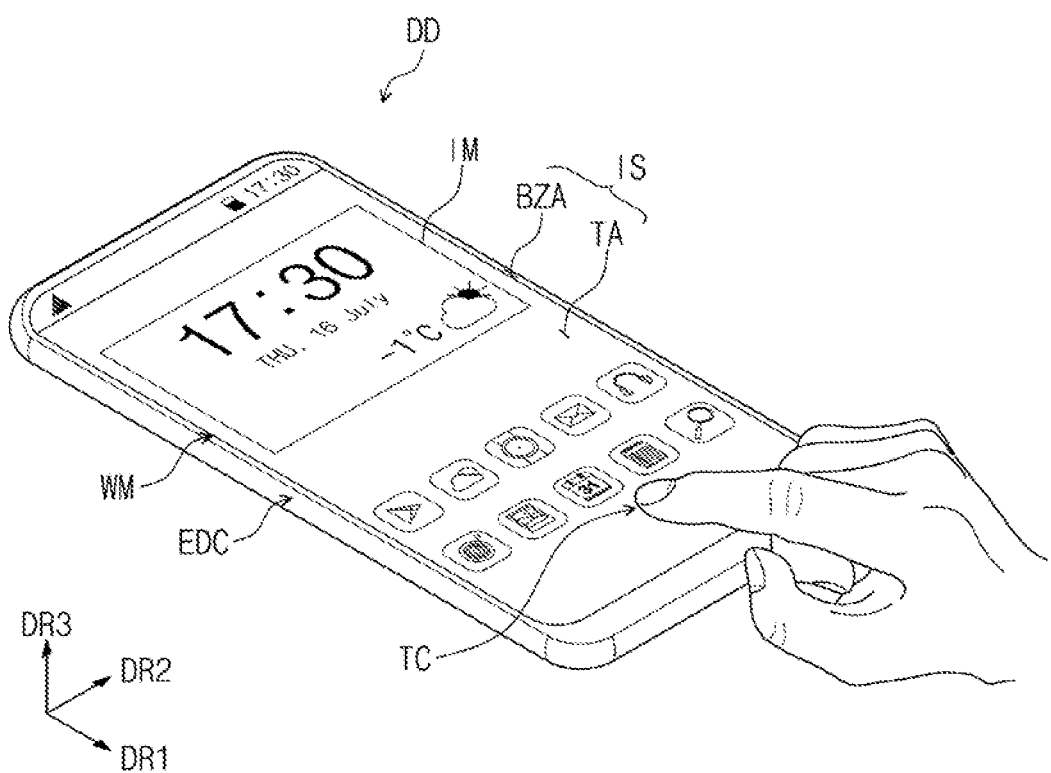
FIG. 1 is a perspective view showing a display device according to an embodiment of the present inventive concept.

In the present disclosure, it will be understood that when an element or layer is referred to as being "on", "connected to" or "coupled to" another element or layer, it can be directly on, connected or coupled to the other element or layer or intervening elements or layers may be present. When an element or layer is referred to as being "directly on", "directly connected to" or "directly coupled to" another element or layer, no intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the present inventive concept. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present inventive concept will be explained in detail with reference to the accompanying drawings.

Figure 2:
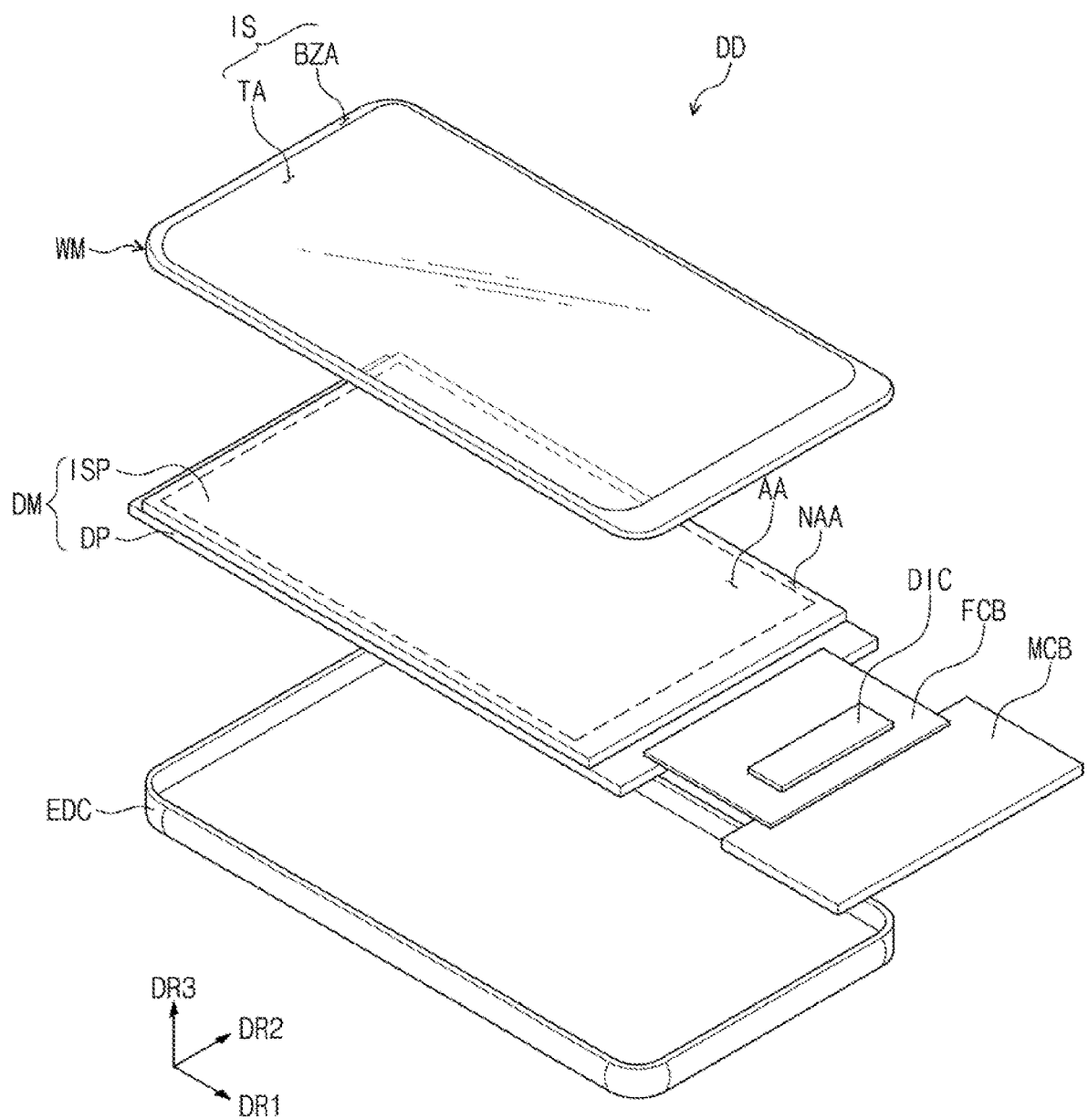
FIG. 2 is an exploded perspective view showing a display device according to an embodiment of the present inventive concept.

FIG. 1 is a perspective view showing a display device DD according to an embodiment of the present inventive concept, and FIG. 2 is an exploded perspective view showing the display device DD according to an embodiment of the present inventive concept.

Referring to FIGS. 1 and 2, in an embodiment, the display device DD may have a rectangular shape defined by relatively long sides extending in a first direction DR1 and relatively short sides extending in a second direction DR2 crossing the first direction DR1. However, the shape of the display device DD should not be limited to the rectangular shape, and the display device DD may have a variety of shapes.

In an embodiment, the display device DD may be applied to a large-sized display device, such as a television set or a monitor, or a small and medium-sized display device, such as a mobile phone, a tablet computer, a car navigation unit, or a game unit. However, embodiments of the present inventive concept are not limited thereto, and the display device DD may be applied to other electronic devices of various different sizes.

The display device DD may display an image IM toward a third direction DR3 through a display surface IS that extends in a plane defined in the first direction DR1 and the second direction DR2. The display surface IS through which the image IM is displayed may correspond to a front surface of the display device DD. In an embodiment, the image IM may include at least one video and/or still images of varying different content. For example, in FIG. 1, the image IM is shown as being a clock, date and weather window and a plurality of icons associated with software applications. However, embodiments of the present inventive concept are not limited thereto.

In the present embodiment, front (or upper) and rear (or lower) surfaces of each member are defined with respect to the third direction DR3 in which the image IM is displayed. The front and rear surfaces are opposite to each other in the third direction DR3, and a normal line direction of each of the front and rear surfaces may be substantially parallel to the third direction DR3.

However, the first, second, and third directions DR1, DR2, and DR3 are relative to each other and may be changed in other directions.

The display device DD may sense an external input TC applied thereto from the outside. The external input TC may include various forms of inputs provided from the outside of the display device DD. For example, in an embodiment, the external input TC may include one of inputs of various forms, such as a part of the users body, light, heat, or pressure, or a combination thereof. In addition, the external input TC may include inputs occurring by input devices, such as a stylus pen, an active pen, a touch pen, an electronic pen, etc., other than a user's hand. In the embodiment of FIG. 1, the external input TC is shown as the user's finger that touches the front surface. However, this is merely one example, and the external input TC may be provided in various ways. In addition, the display device DD may sense the external input TC applied to a side surface or a rear surface of the display device DD according to a structure of the display device DD and embodiments of the present concept are not limited to sensing the external input TC from the front surface. The display device DD may obtain location information of the external input TC, for example, coordinate information.

The front surface of the display device DD may include a transmission area TA and a bezel area BZA. The transmission area TA may be an area through which the image IM is displayed. The user may view the image IM through the transmission area TA. In the present embodiment, the transmission area TA may have a quadrangular shape with rounded vertices. However, embodiments of the present inventive concept are not limited thereto and the transmission area IA may have a variety of shapes.

The bezel area BZA may be defined adjacent to the transmission area TA. In an embodiment, the bezel area BZA may have a predetermined color. The bezel area BZA may surround the transmission area TA. For example, in an embodiment, the bezel area BZA may completely surround the transmission area TA (e.g., in the first and second directions DR1, DR2). However, embodiments of the present inventive concept are not limited thereto. Accordingly, the transmission area TA may have a shape defined by the bezel area BZA. However, this is merely one example. For example, in an embodiment, the bezel area BZA may be disposed adjacent to only one side of the transmission area TA or may be omitted. According to an embodiment, the display device DD may include various different arrangements and should not be particularly limited.

As shown in FIG. 2, the display device DD may include a display module DM and a window WM disposed on the display module DM (e.g., disposed directly thereon in the third direction DR3). The display module DM may include a display panel DP and an input sensing layer ISP.

The display panel DP according to an embodiment of the present inventive concept may be a light-emitting type display panel. However, embodiments of the present inventive concept are not limited thereto. For example, the display panel DP may be an organic light emitting display panel or a quantum dot light emitting display panel. A light emitting element of the organic light emitting display panel may include an organic light emitting material. A light emitting element of the quantum dot light emitting display panel may include a quantum dot or a quantum rod. Hereinafter, the organic light emitting display panel will be described as a representative example of the display panel DP. The display panel DP may output the image IM, and the output image IM may be displayed through the display surface IS.

FIGS. 1 and 2 show the display device DD having a flat structure as a representative example. However, embodiments of the present inventive concept are not limited thereto. The display device DD may be curved or folded with respect to a folding axis and may also have a slidable structure.

The input sensing layer ISP may sense the external input TC and may obtain the coordinate information about the external input TC. Configurations and operations of the input sensing layer ISP will be described with reference to FIGS. 3 and 4.

The window WM may include a transparent material that transmits the image IM. For example, in an embodiment, the window WM may include a glass, sapphire, or plastic material. However, embodiments of the present inventive concept are not limited thereto. The window WM may have a single-layer structure or may include a plurality of layers.

In an embodiment, the bezel area BZA of the display device DD may be defined by printing a material having a predetermined color on an area of the window WM. As an example, the window WM may include a light blocking pattern to define the bezel area BZA. In an embodiment, the light blocking pattern may be a colored organic layer and may be formed by a coating method.

The window WM may be coupled with the display module DM by an adhesive film. For example, in an embodiment, the adhesive film may include an optically clear adhesive film (OCA). However, the adhesive film should not be limited thereto or thereby, and the adhesive film may include an ordinary adhesive. For example, the adhesive film may include an optically clear resin (OCR) or a pressure sensitive adhesive film (PSA).

In an embodiment, an anti-reflective layer may be disposed between the window WM and the display module DM. The anti-reflective layer may reduce a reflectance of an external light incident thereto from the above of the window WM. According to an embodiment of the present inventive concept, the anti-reflective layer may include a retarder and a polarizer. The retarder may be a film type or liquid crystal coating type and may include a λ/2 retarder and/or a λ/4 retarder. The polarizer may be a film type or liquid crystal coating type. The film type polarizer may include a stretching type synthetic resin film, and the liquid crystal coating type polarizer may include liquid crystals aligned in a predetermined alignment. In an embodiment, the retarder and the polarizer may be implemented as one polarizing film.

The display module DM may display the image IM in response to electrical signals and may transmit/receive information on the external input. The display module DM may include an active area AA and a peripheral area NAA. The active area AA may be defined as an area through which the image IM provided from the display module DM is transmitted. In addition, the active area AA may be defined as an area where the input sensing layer ISP senses the external input TC applied thereto from the outside.

The peripheral area NAA may be defined adjacent to the active area AA. For example, the peripheral area NAA may surround the active area AA (e.g., in the first and/or second directions DR1, DR2). However, this is merely one example, and the peripheral area NAA may be defined in various shapes and should not be particularly limited. According to an embodiment, the active area AA of the display module DM may correspond to at least a portion of the transmission area TA.

The display module DM may further include a main circuit board MCB, a flexible circuit film FCB, and a driving chip DIC. The main circuit board MCB may be connected to the flexible circuit film FCB and may be electrically connected to the display panel DP. The flexible circuit film FCB may be connected to the display panel DP and may electrically connect the display panel DP to the main circuit board MCB. The input sensing layer ISP may also be electrically connected to the main circuit board MCB via the flexible circuit film FCB. However, embodiments of the present inventive concept are not limited thereto. For example, in some embodiments, the display module DM may further include a separate flexible circuit film to electrically connect the input sensing layer ISP to the main circuit board MCB.

The main circuit board MCB may include a plurality of driving elements. The driving elements may include a circuit to drive the display panel DP. The driving chip DIC may be mounted on the flexible circuit film FCB. However, embodiments of the present inventive concept are limited thereto. For example, in an embodiment, the driving chip DIC may be disposed directly on the display panel DP. In this embodiment, a portion of the display panel DP on which the driving chip DIC is mounted may be bent to be disposed on a rear surface of the display module DM. The driving chip DIC may include driving elements, for example, a data driving circuit, to drive a pixel of the display panel DP.

In an embodiment, the display device DD may further include a controller to control a drive of the input sensing layer ISP. For example, in an embodiment, the controller may be mounted on the main circuit board MCB. However, embodiments of the present inventive concept are not limited thereto. For example, in an embodiment, the controller may be built in the driving chip DIC.

The display device DD may further include an external case EDC that is configured to receive and accommodate the display module DM. The external case EDC may be coupled with the window WM to define an appearance of the display device DD. The external case EDC may absorb impacts applied thereto from the outside and may prevent foreign substance and moisture from entering the display module DM to protect components housed in the external case EDC. In an embodiment, the external case EDC may be provided in a form in which a plurality of storage members is combined with each other.

According to an embodiment, the display device DD may further include an electronic module including various functional modules to operate the display module DM, a power supply module supplying a power required for an overall operation of the display device DD, and a bracket coupled to the display module DM and/or the external case EDC to divide an inner space of the display device DD.

Figure 3:
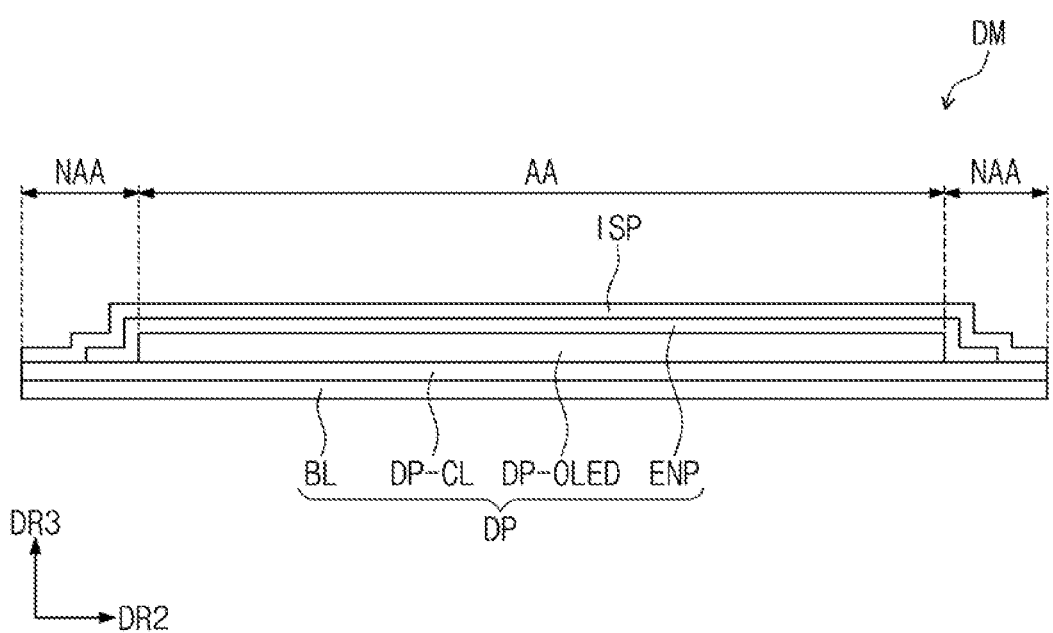
FIG. 3 is a cross-sectional view showing a display module according to an embodiment of the present inventive concept.

FIG. 3 is a cross-sectional view showing the display module DM according to an embodiment of the present inventive concept.

Referring to FIG. 3, the display module DM may include the display panel DP and the input sensing layer ISP. The display panel DP may include a base layer BL, a circuit element layer DP-CL, a display element layer DP-OLED, and an encapsulation layer ENP. The circuit element layer DP-CL, the display element layer DP-OLED, and the encapsulation layer ENP may be disposed on the base layer BL. In an embodiment, the display panel DP may further include functional layers, such as an anti-reflective layer, a refractive index adjustment layer, etc.

In an embodiment, the base layer BL may include at least one plastic film. The base layer BL may be a flexible substrate and may include a plastic substrate, a glass substrate, a metal substrate, or an organic/inorganic composite substrate. The active area AA and the peripheral area NAA described with reference to FIG. 2 may be applied to the base layer BL in the same way.

The circuit element layer DP-CL may include at least one intermediate insulating layer and a circuit element. The intermediate insulating layer may include at least one intermediate inorganic layer and at least one intermediate organic layer. The circuit element may include signal lines and a pixel driving circuit.

Figure 5:
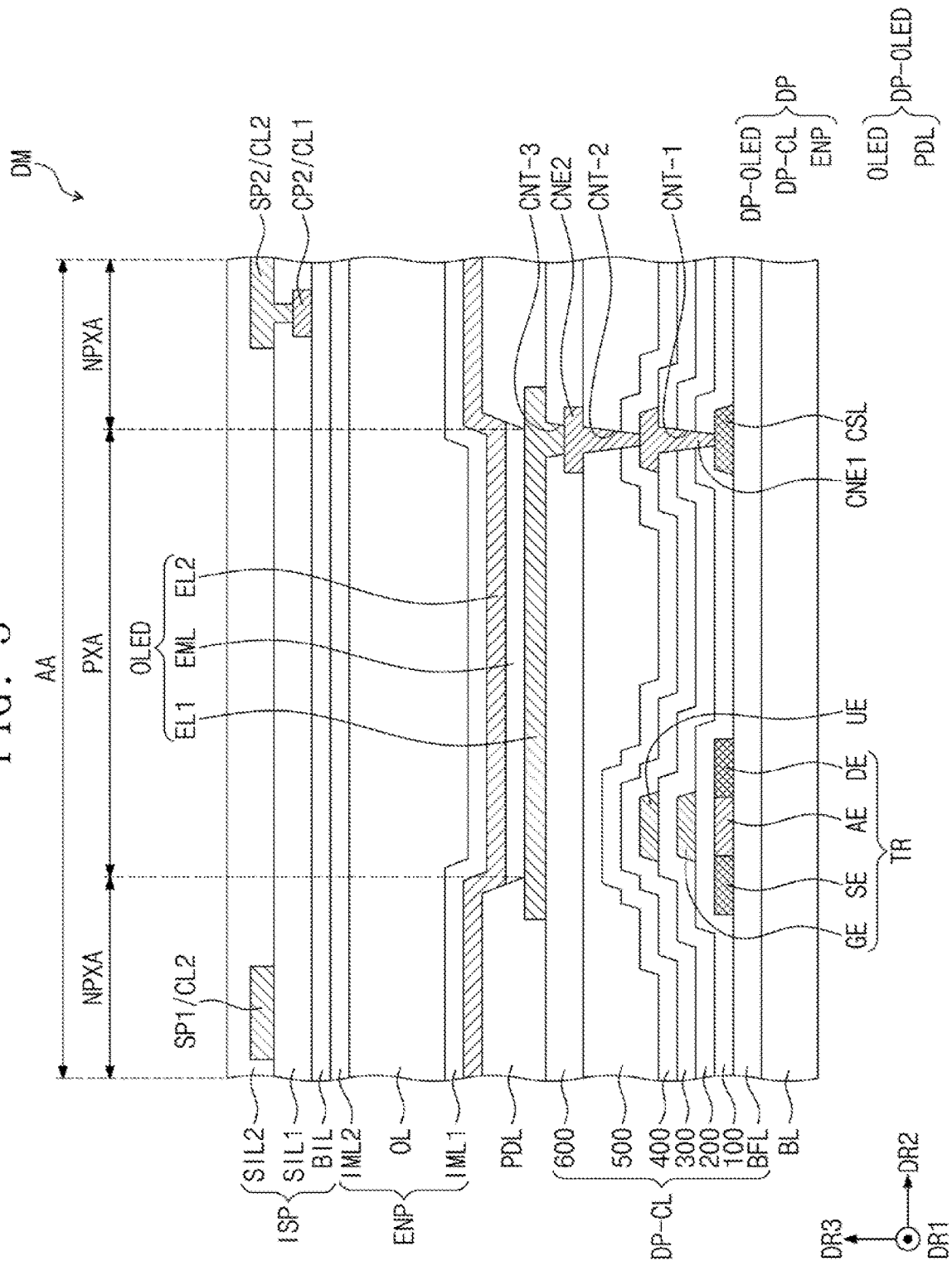
FIG. 5 is a cross-sectional view showing a portion of a display module in an active area according to an embodiment of the present inventive concept.

The display element layer DP-OLED may include a light emitting element OLED (refer to FIG. 5). In an embodiment, the light emitting element OLED may include at least organic light emitting diodes. The display element layer DP-OLED may further include an organic layer such as a pixel definition layer PDL (refer to FIG. 5).

The encapsulation layer ENP may encapsulate the display element layer DP-OLED. The encapsulation layer ENP may include at least one inorganic layer. The encapsulation layer ENP may further include at least one organic layer. The inorganic layer may protect the display element layer DP-OLED from moisture and oxygen, and the organic layer may protect the display element layer DP-OLED from a foreign substance such as dust particles. In an embodiment, the inorganic layer may include a silicon nitride layer, a silicon oxynitride layer, a silicon oxide layer, a titanium oxide layer, or an aluminum oxide layer. The organic layer may include an acrylic-based organic layer. However, embodiments of the present inventive concept are not limited thereto.

In an embodiment, the input sensing layer ISP may be formed on the display panel DP through successive processes. In addition, the input sensing layer ISP may be coupled with the display panel DP by an adhesive film. The input sensing layer ISP may have a multi-layer structure. The input sensing layer ISP may have a single-layer structure of an insulating layer or a multi-layer structure of insulating layers. In an embodiment in which the input sensing layer ISP is disposed directly on the display panel DP through the successive processes, the input sensing layer ISP may be disposed directly on the encapsulation layer ENP, and the adhesive film may not be disposed between the input sensing layer ISP and the display panel DP. However, embodiments of the present inventive concept are not limited thereto. For example, in an embodiment, the adhesive film may be disposed between the input sensing layer ISP and the display panel DP. In this embodiment, the input sensing layer ISP may not be manufactured through the successive processes with the display panel DP, and the input sensing layer ISP may be fixed to an upper surface of the display panel DP by the adhesive film after being manufactured through a separate process.

In an embodiment, the input sensing layer ISP may obtain the coordinate information about the external input TC (refer to FIG. 1) by a capacitance method.

Figure 4:
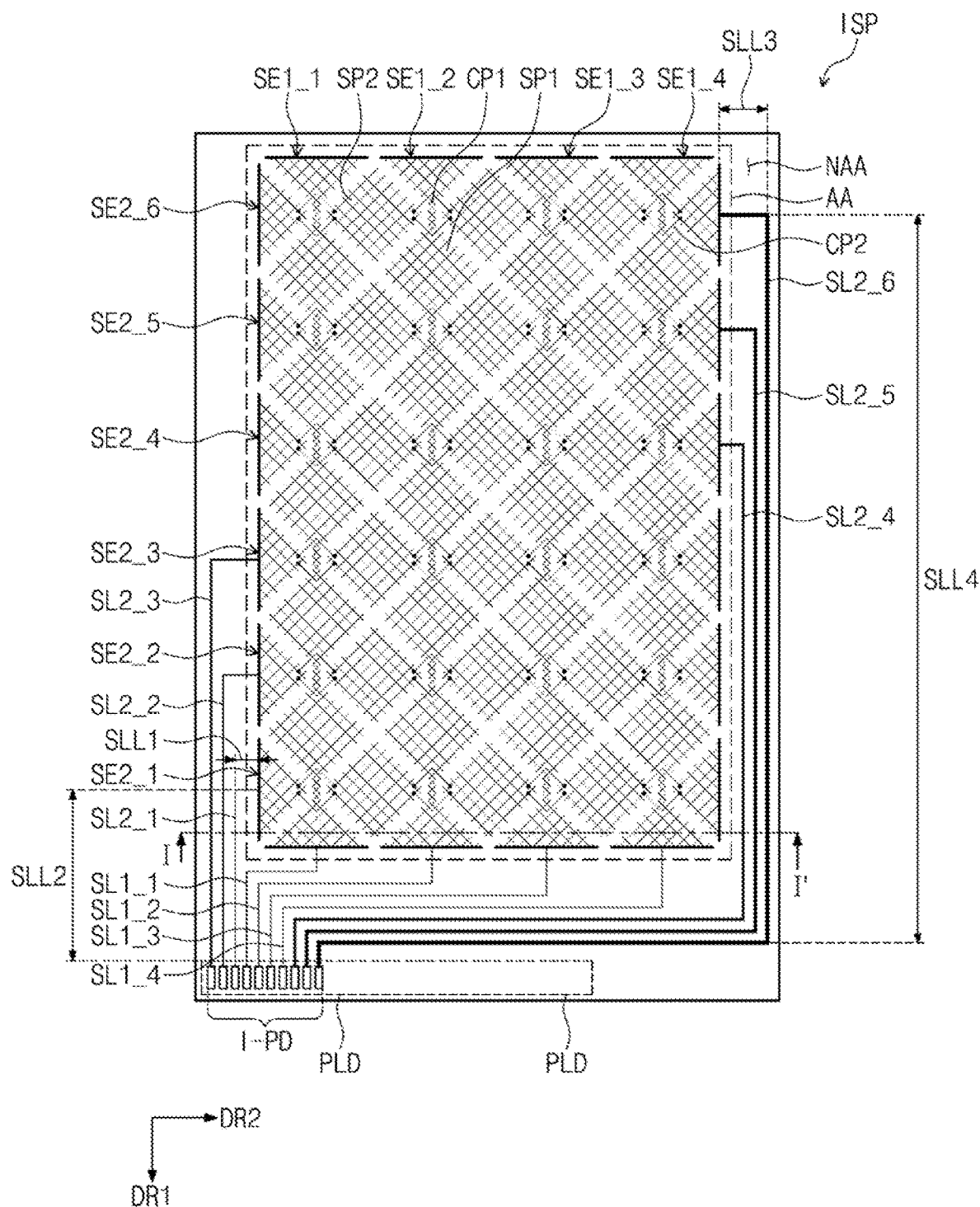
FIG. 4 is a plan view showing an input sensing layer according to an embodiment of the present inventive concept.

FIG. 4 is a plan view showing the input sensing layer ISP according to an embodiment of the present inventive concept.

Referring to FIG. 4, the input sensing layer ISP may include transmission electrodes SE1_1 ... to SE1_4 and reception electrodes SE2_1 to SE2_6. The input sensing layer ISP may further include transmission trace lines SL1_1 to SL1_4 connected to one side of each of the transmission electrodes SE1_1 to SE1_4, respectively, and reception trace lines SL2_1 to SL2_6 connected to one side of each of the reception electrodes SE2_1 to SE2_6, respectively. The transmission electrodes SE1_1 to SE_4 and the reception electrodes SE2_1 to SE2_6 may be referred to as sensing electrodes. The transmission trace lines SL1_1 to SL1_4 and the reception trace lines SL2_1 to SL2_6 may be referred to as signal lines.

For example, in an embodiment, the transmission electrodes SE1_1 to SE1_4 may include a first transmission electrode SE1_1, a second transmission electrode SE1_2, a third transmission electrode SE1_3, and a fourth transmission electrode SE1_4. The reception electrodes SE2_1 to SE2_6 may include a first reception electrode SE2_1, a second reception electrode SE2_2, a third reception electrode SE2_3, a fourth reception electrode SE2_4, a fifth reception electrode SE2_5, and a sixth reception electrode SE2_6.

The transmission trace lines SL1_1 to SL_4 may include a first transmission trace line SL1_1, a second transmission trace line SL1_2, a third transmission trace line SL1_3, and a fourth transmission trace line SL1_4. The reception trace lines SL2_1 to SL2_6 may include a first reception trace line SL2_1, a second reception trace line SL2_2, a third reception trace line SL2_3, a fourth reception trace line SL2_4, a fifth reception trace line SL2_5, and a sixth reception trace line SL2_6. However, embodiments of the present inventive concept are not limited thereto and the numbers of the transmission electrodes, reception electrodes, transmission trace lines and reception trace lines may vary.

The first to fourth transmission trace lines SL1_1 to SL1_4 may be connected to the one side of each of the first to fourth transmission electrodes SE1_1 to SE1_4, respectively. For example, the first to fourth transmission trace lines SL1_1 to SL1_4 may be connected to a lower side of the first to fourth transmission electrodes SE1_1 to SE1_4 in the first direction DR1. However, embodiments of the present inventive concept are not limited thereto. The first to sixth reception trace lines SL2_1 to SL2_6 may be connected to the one side of each of the first to sixth reception electrodes SF2_1 to SE2_6, respectively. For example, the first to third reception trace lines SL2_1 to SL2_3 may be connected to a left side of the first to third reception electrodes SE2_1 to SE2_3 that is in a direction opposite to the second direction DR2, respectively, and the fourth to sixth reception trace lines SL2_4 to SL2_6 may be connected to a right side of the fourth to sixth reception electrodes SE2_4 to SE2_6 that is in the second direction DR2. However, embodiments of the present inventive concept are not limited thereto.

The first to fourth transmission electrodes SE1_1 to SE1_4 may cross the first to sixth reception electrodes SE2_1 to SE2_6. A capacitor may be formed between the first to fourth transmission electrodes SE1_1 to SE1_4 and the first to sixth reception electrodes SE2_1 to SE2_6. A capacitance of the capacitor may be changed by the external input TC (refer to FIG. 1).

Each of the first to fourth transmission electrodes SE1_1 to SE1_4 may include first sensor parts SP1 and first connector parts CP1, which are disposed in the active area AA. Each of the first to sixth reception electrodes SE2_1 to SE2_6 may include second sensor parts SP2 and second connector parts CP2, which are disposed in the active area AA.

For example, FIG. 4 shows four transmission electrodes SE1_1 to SE1_4 and six reception electrodes SE2_1 to SE2_6. However, the number of the transmission electrodes and the number of the reception electrodes should not be limited thereto or thereby. The transmission electrodes may include m transmission electrodes, and the reception electrodes may include n reception electrodes. In the present embodiment, each of "m" and "n" may be a natural number equal to or greater than 1, and "m" and "n" may be the same as each other or different from each other.

FIG. 4 shows the first sensor parts SP1 and the second sensor parts SP2 each of which has a lozenge shape. However, embodiments of the present inventive concept are not limited thereto and the shape of the first and second sensor parts SP1 and SP2 may vary. For example, each of the first sensor parts SP1 and the second sensor parts SP2 may have other polygonal shapes.

In an embodiment, the first sensor parts SP1 may be arranged in the first direction DR1 along one transmission electrode, and the first to fourth transmission electrodes SE1_1 to SE1_4 may be arranged in the second direction DR2 to be spaced apart from each other. In one reception electrode, the second sensor parts SP2 may be arranged in the second direction DR2 along the reception electrode, and the first to sixth reception electrodes SE2_1 to SE2_6 may be arranged in the first direction DR1 to be spaced apart from each other.

Each of the first connector parts CP1 may electrically connect the first sensor parts SP1 adjacent to each other, and each of the second connector parts CP2 may electrically connect the second sensor parts SP2 adjacent to each other.

For example, the first sensor parts SP1 included in the first to fourth transmission electrodes SE1_1 to SE1_4 and the second sensor parts SP2 included in the first to sixth reception electrodes SE2_1 to SE2_6 may have a mesh shape. As the first to fourth transmission electrodes SE1_1 to SE1_4 and the first to sixth reception electrodes SE2_1 to SE2_6 have the mesh shape, a capacitance of a parasitic capacitor formed between the first to fourth transmission electrodes SE1_1 to SE1_4 and electrode layers of the display panel DP (refer to FIG. 3) or a capacitance of a parasitic capacitor formed between the first to sixth reception electrodes SE2_1 to SE2_6 and the electrode layers may be reduced.

In an embodiment, the first to fourth transmission electrodes SE1_1 to SE_4 and the first to sixth reception electrodes SE2_1 to SE2_6, which have the mesh shape, may include at least one compound selected from silver (Ag), aluminum (Al), copper (Cu), chromium (Cr), nickel (Ni), titanium (Ti), etc., which are able to be processed at a low temperature. Since the first to fourth transmission electrodes SE1_1 to SE1_4 and the first to sixth reception electrodes SE2_1 to SE2_6 are formed of the above-mentioned materials that are able to be processed at the low temperature, the organic light emitting diodes included in the display panel DP may be prevented from being damaged even though the input sensing layer ISP is formed on the display panel DP through the successive processes. However, embodiments of the present inventive concept are not limited thereto and the first to fourth transmission electrodes SE1_1 to SE1_4 and the first to sixth reception electrodes SE2_1 to SE2_6 may include a variety of materials other than the above-mentioned materials.

According to an embodiment, the input sensing layer ISP may further include trace lines connected to the other sides of the first to fourth transmission electrodes SE1_1 to SE1_4. According to an embodiment, the input sensing layer ISP may further include trace lines connected to the other sides of the first to sixth reception electrodes SE2_1 to SE2_6, respectively.

The first to fourth transmission trace lines SL1_1 to SL1_4 and the first to sixth reception trace lines SL2_1 to SL2_6 may be disposed in the peripheral area NAA. As shown in the embodiment of FIG. 4, the first to third reception trace lines SL2_1 to SL2_3 may be disposed adjacent to a first side of the active area AA, and the fourth to sixth reception trace lines SL2_4 to SL2_6 may be disposed adjacent to the second side of the active area AA that is opposite to the first side of the active area AA. For example, the first side of the active area AA may be a left side (e.g., a side of the active area AA in a direction opposite to the second direction DR2) and the second side of the active area AA may be a right side (e.g., a side of the active area in the second direction DR2). The first to third reception trace lines SL2_1 to SL2_3 may be spaced apart from the fourth to sixth reception trace lines SL2_4 to SL2_6 with respect to the active area AA in the second direction DR2.

The input sensing layer ISP may further include a pad part PLD disposed in the peripheral area NAA. The pad part PLD may be connected to the flexible circuit film FCB (refer to FIG. 2) and may include input pads I-PD to connect the flexible circuit film FCB to the input sensing layer ISP. The first to fourth transmission trace lines SL1_1 to SL1_4 and the first to sixth reception trace lines SL2_1 to SL2_6 may be connected to the input pads I-PD.

FIG. 5 is a cross-sectional view showing a portion of the display module DM in the active area AA according to an embodiment of the present inventive concept.

The display module DM may include the display panel DP and the input sensing layer ISP. The display panel DP may include the base layer BL, the circuit element layer DP-CL, the display element layer DL-OLED, and the encapsulation layer ENP.

In an embodiment, the base layer BL may include a synthetic resin film. The synthetic resin film may include a heat-curable resin. The base layer BL may have a multi-layer structure. For instance, the base layer BL may have a three-layer structure of a synthetic resin layer, an adhesive layer, and a synthetic resin layer. For example, the synthetic resin layer may be a polyimide-based resin layer. However, embodiments of the present inventive concept are not limited thereto and the material of the synthetic resin layer may vary. The synthetic resin layer may include at least one material selected from an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer BL may include a glass substrate, a metal substrate, or an organic/inorganic composite substrate. However, embodiments of the present inventive concept are not limited thereto.

In an embodiment, at least one inorganic layer may be disposed on an upper surface of the base layer BL. The inorganic layer may include at least one compound selected from aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer. For example, as shown in the embodiment of FIG. 5, the circuit element layer DP-CL may include a buffer layer BFL.

The circuit element layer DP-CL may include a plurality of intermediate insulating layers, a semiconductor pattern, a conductive pattern, and a signal line. In an embodiment, the intermediate insulating layers, the semiconductor pattern, the conductive pattern and the signal line may be formed by a coating or depositing process. The intermediate insulating layers, the semiconductor pattern, the conductive pattern and the signal line may then be selectively patterned through photolithography processes. Thus, the intermediate insulating layers, the semiconductor pattern, the conductive pattern, and the signal line included in the circuit element layer DP-CL may be formed.

The circuit element layer DP-CL may include the buffer layer BFL, a first intermediate insulating layer 100, a second intermediate insulating layer 200, a third intermediate insulating layer 300, a fourth intermediate insulating layer 400, a fifth intermediate insulating layer 500, and a sixth intermediate insulating layer 600 that are consecutively disposed on each other in the third direction DR3.

The buffer layer BFL may increase an adhesion between the base layer BL and the semiconductor pattern. In an embodiment, the buffer layer BFL may include a silicon oxide layer and a silicon nitride layer, and the silicon oxide layer and the silicon nitride layer may be alternately stacked with each other.

The semiconductor pattern may be disposed on the buffer layer BEL. In an embodiment, the semiconductor pattern may include polysilicon. However, embodiments of the present inventive concept are not limited thereto. For example, in an embodiment, the semiconductor pattern may include amorphous silicon or metal oxide.

FIG. 5 shows only a portion of the semiconductor pattern, and the semiconductor pattern may be further disposed in other areas of the pixel in a plane. For example, the semiconductor pattern may be arranged with a specific rule over the pixels PX. The semiconductor pattern may have different electrical properties depending on whether it is doped or not doped and whether it is doped with an N-type dopant or a P-type dopant. The semiconductor pattern may include a first semiconductor region having a relatively high conductance and a second semiconductor region having a relatively low conductance. The first semiconductor region may be doped with the N-type dopant or the P-type dopant. A P-type transistor may include a region doped with the P-type dopant. The second semiconductor region may be a non-doped region or may be doped at a concentration lower than that of the first semiconductor region.

The first semiconductor region may have a conductivity greater than that of the second semiconductor region and may substantially serve as an electrode or signal line. The second semiconductor region may substantially correspond to a channel (or an active) area of a transistor. For example, a portion of the semiconductor pattern may be the channel area of the transistor, another portion of the semiconductor pattern may be a source area or a drain area of the transistor, and the other portion of the semiconductor pattern may be a connection electrode or a connection signal line.

As shown in the embodiment of FIG. 5, a source area SE, a channel area AE, and a drain area DE of a transistor TR may be formed from the semiconductor pattern. The source area SE and the drain area DE may extend in opposite directions from the channel area AE (e.g., in the second direction DR2). FIG. 5 shows a portion of a connection signal line CSL formed from the semiconductor pattern. In an embodiment, the connection signal line CSL may be electrically connected to the drain area DE of the transistor TR when viewed in the plane (e.g., in a plane defined in the first and second directions DR1, DR2).

The first intermediate insulating layer 100 may be disposed on the buffer layer BFL. In an embodiment, the first intermediate insulating layer 100 may commonly overlap a plurality of pixels and may cover the semiconductor pattern. In an embodiment, the first intermediate insulating layer 100 may be an inorganic layer and/or an organic layer and may have a single-layer or multi-layer structure. For example, in an embodiment, the first intermediate insulating layer 100 may include at least one compound selected from aluminum oxide, titanium oxide, silicon oxide, silicon oxynitride, zirconium oxide, and hafnium oxide. In an embodiment, the first intermediate insulating layer 100 may have a single-layer structure of a silicon oxide layer. However, embodiments of the present inventive concept are not limited thereto. For example, the first intermediate insulating layer 100, as well as the second, third, fourth, fifth, and sixth intermediate insulating layers 200, 300, 400, 500, and 600 of the circuit element layer DP-CL described later may be an inorganic layer and/or an organic layer of various different materials and may have a single-layer or multi-layer structure. The inorganic layer may include at least one of the above-mentioned materials.

A gate GE of the transistor TR may be disposed on the first intermediate insulating layer 100 (e.g., directly thereon in the third direction DR3). The gate GE may correspond to a portion of a metal pattern. The gate GE may overlap the channel area AE (e.g., in the third direction DR3). In an embodiment, the gate GE may be used as a mask in a process of doping the semiconductor pattern.

The second intermediate insulating layer 200 may be disposed on the first intermediate insulating layer 100 (e.g., disposed directly thereon in the third direction DR3) and may cover the gate GE, such as an upper surface and lateral side surfaces of the gate GE. The second intermediate insulating layer 200 may commonly overlap the pixels. The second intermediate insulating layer 200 may be an inorganic layer and/or an organic layer and may have a single-layer or multi-layer structure. For example, in an embodiment, the second intermediate insulating layer 200 may have a single-layer structure of a silicon oxide layer.

An upper electrode UE may be disposed on the second intermediate insulating layer 200 (e.g., disposed directly thereon in the third direction DR3). The upper electrode UE may overlap the gate GE (e.g., in the third direction DR3). The upper electrode UE may correspond to a portion of a metal pattern. A portion of the gate GE and the upper electrode UE overlapping the portion of the gate GE may define a capacitor. However, embodiments of the present inventive concept are not limited thereto. For example, in an embodiment, the upper electrode UE may be omitted.

The third intermediate insulating layer 300 may be disposed on the second intermediate insulating layer 200 (e.g., disposed directly thereon in the third direction DR3) and may cover the upper electrode UE, such as an upper surface and lateral side surfaces of the upper electrode UE. The third intermediate insulating layer 300 may commonly overlap the pixels. The third intermediate insulating layer 300 may be an inorganic layer and/or an organic layer and may have a single-layer or multi-layer structure. For example, in an embodiment, the third intermediate insulating layer 300 may have a single-layer structure of a silicon oxide layer.

A first connection electrode CNE1 may be disposed on the third intermediate insulating layer 300 (e.g., disposed directly thereon in the third direction DR3). The first connection electrode CNE1 may be connected to the connection signal line CSL via a first contact hole CNT-1 defined through the first second, and third intermediate insulating layers 100, 200, and 300.

The fourth intermediate insulating layer 400 may be disposed on the third intermediate insulating layer 300 (e.g., disposed directly thereon in the third direction DR3). In an embodiment, the fourth intermediate insulating layer 400 may have a single-layer structure of a silicon oxide layer.

The fifth intermediate insulating layer 500 may be disposed on the fourth intermediate insulating layer 400 (e.g., disposed directly thereon in the third direction DR3). In an embodiment, the fifth intermediate insulating layer 500 may be an organic layer. A second connection electrode CNE2 may be disposed on the fifth intermediate insulating layer 500 (e.g., disposed directly thereon in the third direction DR3). The second connection electrode CNE2 may be connected to the first connection electrode CNE1 via a second contact hole CNT-2 defined through the fourth and fifth intermediate insulating layers 400 and 500.

The sixth intermediate insulating layer 600 may be disposed on the fifth intermediate insulating layer 500 (e.g., disposed directly thereon in the third direction DR3) and may cover the second connection electrode CNE2, such as an upper surface and lateral side surfaces of the second connection electrode CNE2. In an embodiment, the sixth intermediate insulating layer 600 may be an organic layer.

The display element layer DP-OLED may be disposed on the circuit element layer DP-CL. For example, the display element layer DP-OLED may include the light emitting element OLED and the pixel definition layer PDL.

The light emitting element OLED may include a first electrode EL1 disposed on the circuit element layer DP-CL, a light emitting layer EML disposed on the first electrode EL1, and a second electrode EL2 disposed on the light emitting layer EML.

The first electrode EL1 may be disposed on the sixth intermediate insulating layer 600 (e.g., disposed directly thereon in the third direction DR3). The first electrode EL1 may be connected to the second connection electrode CNE2 via a third contact hole CNT-3 defined through the sixth intermediate insulating layer 600.

The pixel definition layer PDL may be disposed on the sixth intermediate insulating layer 600 (e.g., disposed directly thereon in the third direction DR3) and may cover a portion of the first electrode EL1. For example, in an embodiment, the pixel definition layer PDL may cover lateral ends of the first electrode EL1 and may expose a central portion of the first electrode EL1. A pixel opening may be defined through the pixel definition layer PDL. For example, the pixel opening may be defined in the central portion of the first electrode EL1 exposed by the pixel definition layer PDL. At least a portion of the first electrode EL1 may be exposed through the pixel opening of the pixel definition layer PDL. For example, a light emitting area PXA may correspond to the portion of the first electrode EL1 exposed through the pixel opening. A non-light-emitting area NPXA may surround the light emitting area PXA. The light emitting layer EML may be disposed on the first electrode EL1 (e.g., in the third direction DR3). The light emitting layer EML may be disposed in an area corresponding to the pixel opening. For example, the light emitting layer EML may be disposed in each of the pixels after being divided into plural portions. The light emitting layer EML may include a light emitting material such as, a fluorescent material or a phosphorescent material. The light emitting material may include an organic light emitting material or an inorganic light emitting material. However, embodiments of the present inventive concept are not limited thereto.

The second electrode EL2 may be disposed on the light emitting layer EML (e.g., in the third direction DR3). In an embodiment, the second electrode EL2 may have an integral shape and may be commonly disposed over the pixels.

For example, the light emitting element OLED may further include a hole control layer and an electron control layer. The hole control layer may be disposed between the first electrode EL1 and the light emitting layer EML and may further include a hole injection layer. The electron control layer may be disposed between the light emitting layer EML and the second electrode EL2 and may further include an electron injection layer.

The encapsulation layer ENP may be disposed on the display element layer DP-OLED (e.g., in the third direction DR3). The encapsulation layer ENP may be disposed on the second electrode EL2.

In an embodiment, the encapsulation layer ENP may be commonly disposed over the pixels. For example, in an embodiment, the encapsulation layer ENP may directly cover the second electrode EL2. In an embodiment, a capping layer may be further disposed between the encapsulation layer ENP and the second electrode EL2 to cover the second electrode EL2. In this embodiment, the encapsulation layer ENP may directly cover the capping layer.

In an embodiment, the encapsulation layer ENP may include a first inorganic layer IML1, an organic layer OL, and a second inorganic layer IML2. The first inorganic layer IML1 and the second inorganic layer IML2 may protect the light emitting element OLED from moisture and oxygen, and the organic layer OL may protect the light emitting element OLED from a foreign substance such as dust particles. In an embodiment, the first and second inorganic layers IML1 and IML2 may include a silicon nitride layer, a silicon oxynitride layer, a silicon oxide layer, a titanium oxide layer, or an aluminum oxide layer. The organic layer may include an acrylic-based organic layer. However, embodiments of the present inventive concept are not limited thereto and the materials of the inorganic layers and the organic layer may vary. Additionally, the numbers of the inorganic layers and the organic layers may vary.

The first inorganic layer IML1 may be disposed on the light emitting element OLED (e.g., in the third direction DR3). The organic layer OL may be disposed on the first inorganic layer IML1 (e.g., in the third direction DR3).

The second inorganic layer IML2 may be disposed on the organic layer OL (e.g., in the third direction DR3).

The input sensing layer ISP may be disposed on the display panel DP (e.g., disposed directly thereon in the third direction DR3). The input sensing layer ISP may include a base insulating layer BIL, a first conductive layer CL1, a first sensing insulating layer SIL1, a second conductive layer CL2, and a second sensing insulating layer SIL2. In an embodiment, each of the first and second sensing insulating layers SIL1 and SIL2 may be an inorganic layer and/or an organic layer and may have a single-layer or multi-layer structure.

The base insulating layer BIL may be disposed directly on the encapsulation layer ENP. For example, a lower surface of the base insulating layer BIL may directly contact an upper surface of the second inorganic layer IML2. The base insulating layer 131L may have a single-layer or a multi-layer structure.

The first conductive layer CL1 may be disposed on the base insulating layer BIL (e.g., disposed directly thereon in the third direction DR3). The first sensing insulating layer SIL1 may be disposed on the first conductive layer CL1 (e.g., disposed directly thereon in the third direction DR3). The first sensing insulating layer SIL1 may be an inorganic layer and/or an organic layer and may have a single-layer or multi-layer structure.

The second conductive layer CL2 may be disposed on the first sensing insulating layer SIL1 (e.g., disposed directly thereon in the third direction DR3). Each of the first conductive layer CL1 and the second conductive layer CL2 may have a single-layer structure or a multi-layer structure of layers stacked in the third direction DR3. The conductive layer having the single-layer structure may include an electrode layer or a transparent conductive layer.

The first conductive layer CL1 and the second conductive layer CL2 may include the first sensor parts SP1, the second sensor parts SP2, the first connector parts CP1 (refer to FIG. 4), and the second connector parts CP2. For example, in an embodiment, the first conductive layer CL1 may include the second connector parts CP2. The second conductive layer CL2 may include the first sensor parts SP1, the second sensor parts SP2, and the first connector parts CP1. However, embodiments of the present inventive concept are not limited thereto. For example, the first sensor parts SP1, the second sensor parts SP2, and the first connector parts CP1 may be included in the first conductive layer CL1, and the second connector parts CP2 may be included in the second conductive layer CL2.

The second sensing insulating layer SIL2 may be disposed on the second conductive layer CL2. The second sensing insulating layer SIL2 may be an inorganic layer and/or an organic layer and may have a single-layer or multi-layer structure.

For example, the first and second sensor parts SP1 and SP2 and the first and second connector parts CP1 and CP2 may be disposed in the non-light-emitting area NPXA.

Figure 6:
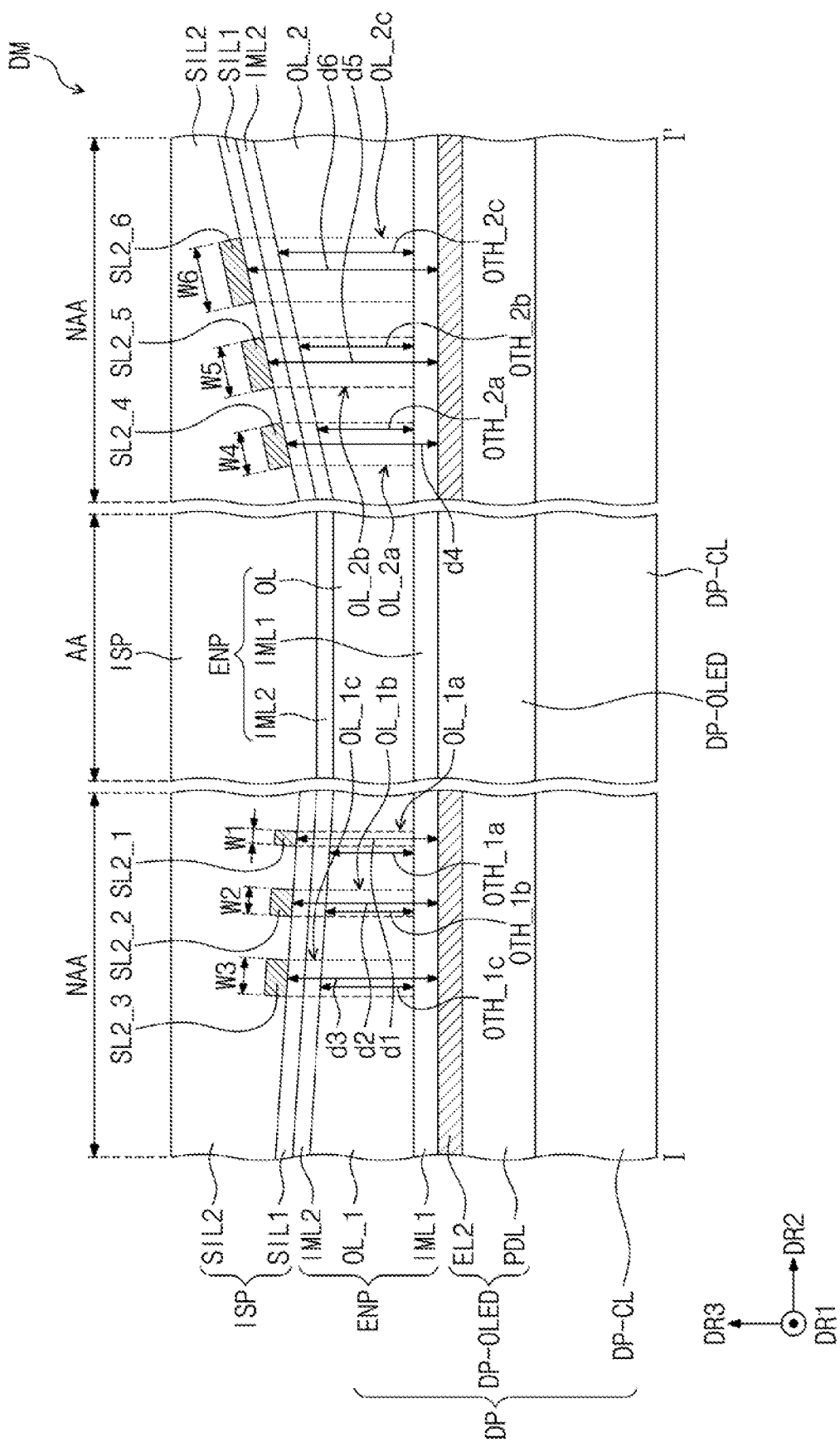
FIGS. 6 and 7 are cross-sectional views showing display modules taken along line I-I' of FIG. 4 according to embodiments of the present inventive concept.
Figure 7:
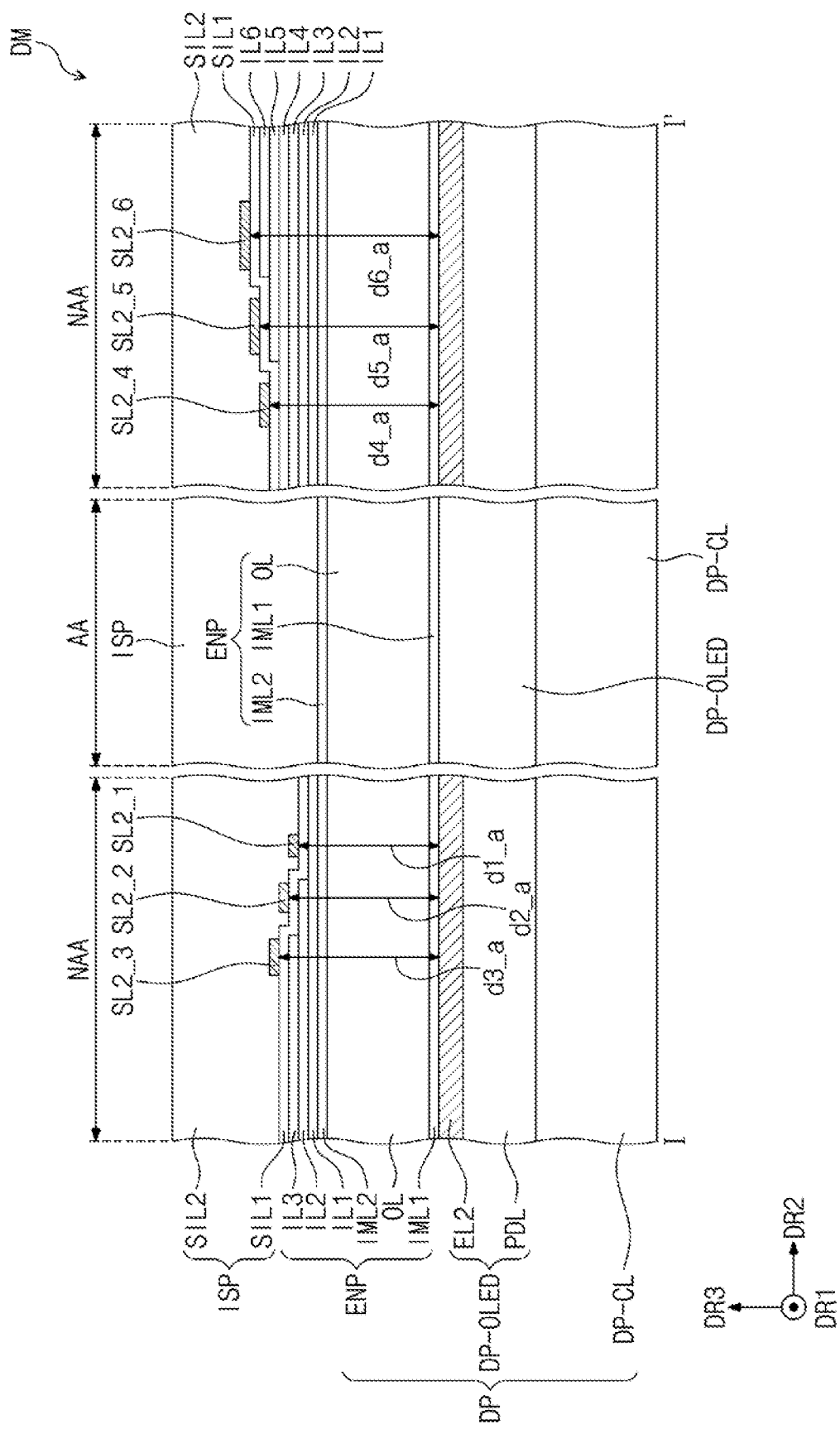

FIGS. 6 and 7 are cross-sectional views showing display modules DM taken along a line I-I' shown in FIG. 4 to explain a relation between a signal line and an encapsulation layer ENP.

In FIGS. 6 and 7, the same reference numerals denote the same elements in FIGS. 4 and 5, and thus, detailed descriptions of the same elements will be omitted for convenience of explanation.

Referring to FIG. 6, first to third reception trace lines SL2_1 to SL2_3 may be disposed in the peripheral area NAA adjacent to a first side of the active area AA, such as a left side of the active area AA that is in a direction opposite to the second direction DR2. Fourth to sixth reception trace lines SL2_4 to SL2_6 may be disposed in the peripheral area NAA adjacent to a second side of the active area AA that is opposite to the first side of the active area AA, such as the right side in the second direction DR2. However, embodiments of the present inventive concept are not limited thereto and the respective orientations of the opposite first and second sides of the active area AA may vary. The fourth to sixth reception trace lines SL2_4 to SL2_6 may be spaced apart from the first to third reception trace lines SL2_1 to SL2_3 with respect to the active area AA in the second direction DR2.

For example, in an embodiment, the first to sixth reception trace lines SL2_1 to SL2_6 may be included in a second conductive layer CL2 (refer to FIG. 5). The first to sixth reception trace lines SL2_1 to SL2_6 may be disposed on a first sensing insulating layer SIL1 and may be connected to one side of first to sixth reception electrodes SE2_1 to SE2_6 (refer to FIG. 4), respectively.

In an embodiment, first to fourth transmission trace lines SL1_1 to SL1_4 (refer to FIG. 4) may be included in the second conductive layer CL2 and may be disposed in the peripheral area NAA.

Referring to FIG. 4, the first to sixth reception trace lines SL2_1 to SL2_6 may have different lengths from each other. For example, in an embodiment, the first to sixth reception electrodes SE2_1 to SE2_6 may be spaced apart from each other and may be arranged in a direction opposite to the first direction DR1 with respect to input pads I-PD. For example, the first to sixth reception electrodes SE2_1 to SE2_6 may be spaced apart from the input pads I-PD by different distances from each other in the first direction DR1. Accordingly, the first to sixth reception trace lines SL2_1 to SL2_6 used to respectively connect the first to sixth reception electrodes SE2_1 to SE2_6 to the input pads I-PD may have different lengths from each other.

Each of the first to sixth reception trace lines SL2_1 to SL2_6 may include a first line portion extending substantially in the second direction DR2 or a direction opposite to the second direction DR2 and a second line portion extending substantially in the first direction DR1. For example, FIG. 4 shows first and second line portions SLL1 and SLL2 of the first reception trace line SL2_1 and first and second line portions SLL3 and SLL4 of the sixth reception trace line SL2_6, as examples of the first and second line portions of the first to sixth reception trace lines SL2_1 to SL2_6.

The first reception trace line SL2_1 may include the first line portion SLL1 extending in the second direction DR2 and the second line portion SLL2 extending in the first direction DR1. The sixth reception trace line SL2_6 may include the first line portion SLL3 extending in the direction opposite to the second direction DR2 and the second line portion SLL4 extending in the first direction DR1.

Hereinafter, the length of each of the first to sixth reception trace lines SL2_1 to SL2_6 may indicate a length of a line portion, such as the second line portion SLL2, SLL4, included in each of the first to sixth reception trace lines SL2_1 to SL2_6 and extending in the first direction DR1 towards the input pads I-PD. However, embodiments of the present inventive concept are not limited thereto. For example, in an embodiment, the length of each of the first to sixth reception trace lines SL2_1 to SL2_6 may indicate a length of a line portion extending in another direction rather than the first direction DR1 according to an arrangement direction of the first to sixth reception electrodes SE2_1 to SE2_6 and a position of the input pads I-PD.

In an embodiment, the first reception electrode SE2_1 may be disposed closest to the input pads I-PD, and the second to sixth reception electrodes SE2_2 to SE2_6 may be spaced apart from each other while being sequentially arranged in the direction opposite to the first direction DR1 with respect to the first reception electrode SE2_1. Accordingly, among the first to sixth reception trace lines SL2_1 to SL2_6, the first reception trace line SL2_1 has the smallest length, and the sixth reception trace line SL2_6 has the greatest length.

However, in an embodiment in which the input sensing layer ISP includes n reception electrodes, the length of the reception trace lines may vary depending on an arrangement of the reception electrodes, and an n-th reception trace line may have the largest or smallest length.

In a comparative embodiment in which the lengths of the first to sixth reception trace lines SL2_1 to SL2_6 are different from each other and widths of the first to sixth reception trace lines SL2_1 to SL2_6 are the same as each other, the first to sixth reception trace lines SL2_1 to SL2_6 may have different line resistances from each other. The widths of the first to sixth reception trace lines SL2_1 to SL2_6 may refer to the lengths in a direction that crosses the first direction DR1 and the third direction DR3. In this embodiment, a difference may occur in delay value of signals having information about the external input TC (FIG. 1) that is transmitted through the first to sixth reception trace lines SL2_1 to SL2_6 due to the different resistances of each of the trace lines SL2_1 to SL2_6 and the capacitance between each of the trace lines SL2_1 to SL2_6 and an electrode layer included in the display panel DP. Accordingly, an error may occur in the location information of the external input TC (refer to FIG. 1) acquired through the input sensing layer ISP. However, in an embodiment of the present inventive concept, the widths W1 to W6 of the first to sixth reception trace lines SL2_1 to SL2_6 may be set to be different from each other to compensate for the difference in length between the first to sixth reception trace lines SL2_1 to SL2_6. For example, as shown in the embodiment of FIG. 6, the widths W1 to W6 of the first to sixth reception trace lines SL2_1 to SL2_6 may be the lengths in a direction parallel to an upper surface of the first sensing insulating layer SIL1.

For example, among the first to sixth reception trace lines SL2_1 to SL2_6, the first reception trace line SL2_1 with the smallest length may have the smallest width W1, and the sixth reception trace line SL2_6 with the greatest length may have the greatest width W6. The length of the sixth reception trace line SL2_6 is greater than the length of the first reception trace line SL2_1. However, since the width W6 of the sixth reception trace line SL2_6 is greater than the width W1 of the first reception trace line SL2_1, the sixth reception trace line SL2_6 may have substantially the same resistance as that of the first reception trace line SL2_1.

Referring to FIGS. 4 and 6, the length of the second reception trace line SL2_2 may be greater than the length of the first reception trace line SL2_1. The width W2 of the second reception trace line SL2_2 may be greater than the width W1 of the first reception trace line SL2_1. The length of the third reception trace line SL2_3 may be greater than the length of the second reception trace line SL2_2. The width W3 of the third reception trace line SL2_3 may be greater than the width W2 of the second reception trace line SL2_2. The length of the fourth reception trace line SL2_4 may be greater than the length of the third reception trace line SL2_3. The width W4 of the fourth reception trace line SL2_4 may be greater than the width W3 of the third reception trace line SL2_3. The length of the fifth reception trace line SL2_5 may be greater than the length of the fourth reception trace line SL2_4. The width W5 of the fifth reception trace line SL2_5 may be greater than the width W4 of the fourth reception trace line SL2_4. The length of the sixth reception trace line SL2_6 may be greater than the length of the fifth reception trace line SL2_5. The width W6 of the sixth reception trace line SL2_6 may be greater than the width W5 of the fifth reception trace line SL2_5. For example, the electrode layer of the display panel DP may include a second electrode EL2. However, embodiments of the present inventive concept are not limited thereto. According to an embodiment, the electrode layer may further include an electrode included in the display element layer DP-OLED, such as the first electrode EL (refer to FIG. 5), or electrodes included in the circuit element layer DP-CL. Hereinafter, for convenience of explanation, the electrode layer of the display panel DP may indicate the second electrode EL2.

In an embodiment, when the widths W1 to W6 of the first to sixth reception trace lines SL2_1 to SL2_6 are different from each other and the distances between each of the first to sixth reception trace lines SL2_1 to SL2_6 and the electrode layer EL2 included in the display panel DP are the same, the capacitance between each of the first to sixth reception trace lines SL2_1 to SL2_6 and the electrode layer EL2 may not be constant. In an embodiment, the distance between each of the first to sixth reception trace lines SL2_1 to SL2_6 and the electrode layer EL2 included in the display panel DP may refer to a length in the third direction DR3. For example, the capacitance between each of the first to sixth reception trace lines SL2_1 to SL2_6 and the second electrode EL2 may be defined by the following Equation 1.

$$C = \varepsilon \frac{s}{d} \qquad \text{<Equation 1>}$$

In Equation 1, C denotes the capacitance, s denotes the width of the reception trace line, d denotes the distance between the reception trace line and the second electrode EL2, and e denotes a permittivity (e.g., the permittivity of the insulating layers disposed between the reception trace line and the electrode layer).

In a comparative embodiment in which the distances between each of the first to sixth reception trace lines SL2_1 to SL2_6 and the second electrode EL2 are the same, the capacitance may increase as the widths of the first to sixth reception trace lines SL2_1 to SL2_6 increase. In this embodiment, a difference may occur in the delay value of the signals that are transmitted through the first to sixth reception trace lines SL2_1 to SL2_6, which is caused by the resistance of each of the trace lines SL2_1 to SL2_6 and the capacitance between each of the trace lines SL2_1 to SL2_6 and the second electrode EL2. Therefore, an error may occur in the location information of the external input TC (refer to FIG. 1) acquired through the input sensing layer ISP. Accordingly, the distances between each of the first to sixth reception trace lines SL2_1 to SL2_6 and the second electrode EL2 may be set to be different from each other to compensate for the difference between the widths W1 to W6 of the first to sixth reception trace lines SL2_1 to SL2_6.

For example, in an embodiment, the distances between each of the first to sixth reception trace lines SL2_1 to SL2_6 and the second electrode EL2 may be set to be different from each other by adjusting the thickness of the encapsulation layer ENP disposed between the first to sixth reception trace lines SL2_1 to SL2_6 and the second electrode EL2.

A portion of the organic layer OL, which is disposed in the peripheral area NAA where the first to third reception trace lines SL2_1 to SL2_3 are disposed, may be referred to as a first organic layer OL_1, and a portion of the organic layer OL, which is disposed in the peripheral area NAA where the fourth to sixth reception trace lines SL2_4 to SL2_6 are disposed, may be referred to as a second organic layer OL_2.

In the first organic layer OL_1, a portion corresponding to (e.g., overlapping in the third direction DR3) the first reception trace line SL2_1 may be referred to as a first encapsulation portion OL_1a, a portion corresponding to (e.g., overlapping in the third direction DR3) the second reception trace line SL2_2 may be referred to as a second encapsulation portion OL_1b, and a portion corresponding to (e.g., overlapping in the third direction DR3) the third reception trace line SL2_3 may be referred to as a third encapsulation portion OL_1c.

In the second organic layer OL_2, a portion corresponding to (e.g., overlapping in the third direction DR3) the fourth reception trace line SL2_4 may be referred to as a fourth encapsulation portion OL_2a, a portion corresponding to (e.g., overlapping in the third direction DR3) the fifth reception trace line SL2_5 may be referred to as a fifth encapsulation portion OL_2b, and a portion corresponding to (e.g., overlapping in the third direction DR3) the sixth reception trace line SL2_6 may be referred to as a sixth encapsulation portion OL_2c.

The first to sixth encapsulation portions OL_1a to OL_2c may be referred to as first to sixth organic layer portions OL_1a to OL_2c, respectively.

For example, an upper surface of the first organic layer OL_1 may be formed to have a first angle with respect to an upper surface of the organic layer OL included in the active area AA. An upper surface of the second organic layer OL_2 may be formed to have a second angle with respect to an upper surface of the organic layer OL included in the active area AA. In an embodiment, the second angle may be greater than the first angle. For example, in an embodiment, the first and second organic layers OL_1 and OL_2 may be formed to have the first angle or the second angle by controlling a time required to apply an organic material or by patterning a photoresist using a half-tone mask or a slit mask provided with a slit. However, embodiments of the present inventive concept are not limited thereto. For example, in an embodiment, the first and second angles of the first and second organic layers OL_1 and OL_2 may be controlled through other processes rather than the above-mentioned processes.

A thickness of the first encapsulation portion OL_1a (e.g., length in the third direction DR3) may be referred to as a first encapsulation thickness OTH_1a. A thickness of the second encapsulation portion OL_1b (e.g., length in the third direction DR3) may be referred to as a second encapsulation thickness OTH_1b. A thickness of the third encapsulation portion OL_1c (e.g., length in the third direction DR3) may be referred to as a third encapsulation thickness OTH_1c. A thickness of the fourth encapsulation portion OL_2a (e.g., length in the third direction DR3) may be referred to as a fourth encapsulation thickness OTH_2a. A thickness of the fifth encapsulation portion OL_2b (e.g., length in the third direction DR3) may be referred to as a fifth encapsulation thickness OTH_2b. A thickness of the sixth encapsulation portion OL_2c (e.g., length in the third direction DR3) may be referred to as a sixth encapsulation thickness OTH_2c.

The first to sixth encapsulation thicknesses OTH_1a to OTH_2c may be different from each other. For example, in an embodiment, the second encapsulation thickness OTH_1b may be greater than the first encapsulation thickness OTH_1a. The third encapsulation thickness OTH_1c may be greater than the second encapsulation thickness OTH_1b. The fourth encapsulation thickness OTH_2a may be greater than the third encapsulation thickness OTH_1c. The fifth encapsulation thickness OTH_2b may be greater than the fourth encapsulation thickness OTH_2a. The sixth encapsulation thickness OTH_2c may be greater than the fifth encapsulation thickness OTH_2b.

A distance (e.g., length in the third direction DR3) between the first reception trace line SL2_1 and the second electrode EL2, a distance between the second reception trace line SL2_2 and the second electrode EL2, a distance between the third reception trace line SL2_3 and the second electrode EL2, a distance between the fourth reception trace line SL2_4 and the second electrode EL2, a distance between the fifth reception trace line SL2_5 and the second electrode EL2, and a distance between the sixth reception trace line SL2_6 and second electrode EL2 may be referred to as a first distance d1, a second distance d2, a third distance d3, a fourth distance d4, a fifth distance d5, and a sixth distance d6, respectively.

The thicknesses of the second inorganic layer IML2 and the first sensing insulating layer SIL1 may be substantially the same corresponding to the first to sixth reception trace lines SL2_1 to SL2_6. Since thicknesses of the first and second organic layers OL_1 and OL_2 disposed between the first to sixth reception trace lines SL2_1 to SL2_6 and the second electrode EL2 are different from each other depending on each corresponding reception trace line among the first to sixth reception trace lines SL2_1 to SL2_6, the first to sixth distances d1 to d6 may be different from each other.

For example, the second distance d2 may be greater than the first distance d1. The third distance d3 may be greater than the second distance d2. The fourth distance d4 may be greater than the third distance d3. The fifth distance d5 may be greater than the fourth distance d4. The sixth distance d6 may be greater than the fifth distance d5. Accordingly, although the width W6 of the sixth reception trace line is greater than the width W1 of the first reception trace line, the capacitance between the sixth reception trace electrode SL2_6 and the second electrode EL2 may be substantially the same as the capacitance between the first reception trace electrode SL2_1 and the second electrode EL2. Consequently, the difference in the delay value of the signals that are transmitted through the first to sixth reception trace lines SL2_1 to SL2_6, which is caused by the resistance of each of the trace lines SL2_1 to SL2_6 and the capacitance between each of the trace lines SL2_1 to SL2_6 and the second electrode EL2 may be prevented from occurring.

Referring to FIG. 7, the upper surface of the organic layer OL in the peripheral area NAA may have the same angle as the upper surface of the organic layer OL in the active area AA. However, the encapsulation layer ENP may further include a first insulating layer IL1, a second insulating layer IL2, a third insulating layer IL3, a fourth insulating layer IL4, a fifth insulating layer IL5, and a sixth insulating layer IL6. For example, each of the first to sixth insulating layers IL1 to IL6 may be an inorganic layer and/or an organic layer and may have a single-layer or multi-layer structure. Hereinafter, each of the first to sixth insulating layers IL1 to IL6 will be described as the inorganic layer for convenience of explanation. However, embodiments of the present inventive concept are not limited thereto.

The first insulating layer IL1 may be disposed on a second inorganic layer IML2 (e.g., disposed directly thereon in the third direction DR3) in the peripheral area NAA in which first to third reception trace lines SL2_1 to SL2_3 are disposed. The first insulating layer IL1 may be disposed to correspond to (e.g., overlap in the third direction DR3) the first to third reception trace lines SL2_1 to SL2_3.

The second insulating layer IL2 may be disposed on the first insulating layer IL1 (e.g., disposed directly thereon in the third direction DR3). The second insulating layer IL2 may be disposed to correspond to (e.g., overlap in the third direction DR3) the second and third reception trace lines SL2_2 and SL2_3.

The third insulating layer IL3 may be disposed on the second insulating layer IL2 (e.g., disposed directly thereon in the third direction DR3). The third insulating layer IL3 may be disposed to correspond to (e.g., overlap in the third direction DR3) the third reception trace line SL2_3.

The first to third reception trace lines SL2_1 to SL2_3 may be disposed on the first sensing insulating layer SIL1 (e.g., disposed directly thereon in the third direction DR3) which is disposed on the first to third insulating layers IL1 to IL3.

The first to third insulating layers IL1 to IL3 may be disposed on the second inorganic layer IML2 in the peripheral area NAA in which fourth to sixth reception trace lines SL2_4 to SL2_6 are disposed.

The fourth insulating layer IL4 may be disposed on the third insulating layer IL3 (e.g., disposed directly thereon in the third direction DR3). The fourth insulating layer IL4 may be disposed to correspond to (e.g., overlap in the third direction DR3) the fourth to sixth reception trace lines SL2_4 to SL2_6.

The fifth insulating layer IL5 may be disposed on the fourth insulating layer IL4 (e.g., disposed directly thereon in the third direction DR3). The fifth insulating layer IL5 may be disposed to correspond to (e.g., overlap in the third direction DR3) the fifth and sixth reception trace lines SL2_5 and SL2_6.

The sixth insulating layer IL6 may be disposed on the fifth insulating layer IL5 (e.g., disposed directly thereon in the third direction DR3). The sixth insulating layer 116 may be disposed to correspond to (e.g., overlap in the third direction DR3) the sixth reception trace line SL2_6.

The fourth to sixth reception trace lines SL2_4 to SL2_6 may be disposed on the first sensing insulating layer SIL1 (e.g., disposed directly thereon in the third direction DR3) which is disposed on the fourth to sixth insulating layers IL4 to IL6.

Since widths or positions of the first to sixth insulating layers IL1 to IL6, which are disposed between the first to sixth reception trace lines SL2_1 to SL2_6 and the second electrode EL2, are different from each other, steps may be formed in the first sensing insulating layer SIL1 between adjacent reception trace lines and the first, second, third, fourth, fifth, and sixth distances d1_a, d2_a, d3_a, d4_a, d5_a, and d6_a (e.g., lengths in the third direction DR3) may be different from each other. For example, as shown in the embodiment of FIG. 7, the second distance d2_a may be greater than the first distance d1_a. The third distance d3_a may be greater than the second distance d2_a. The fourth distance d4_a may be greater than the third distance d3_a. The fifth distance d5_a may be greater than the fourth distance d4_a. The sixth distance d6_a may be greater than the fifth distance d5_a.

Figure 8:
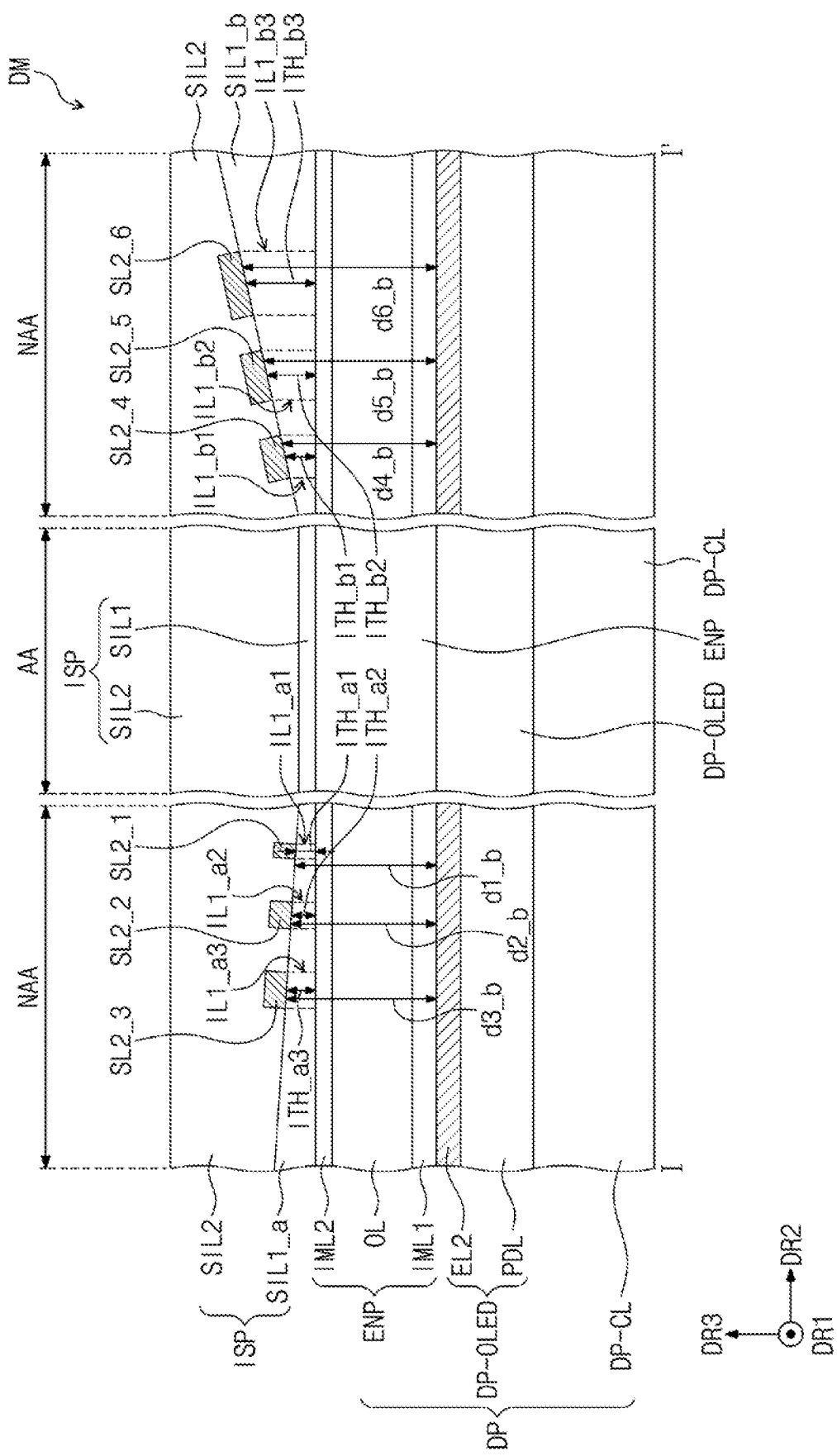
FIGS. 8 and 9 are cross-sectional views showing display modules taken along a line I-I' of FIG. 4 according to embodiments of the present inventive concept.
Figure 9:
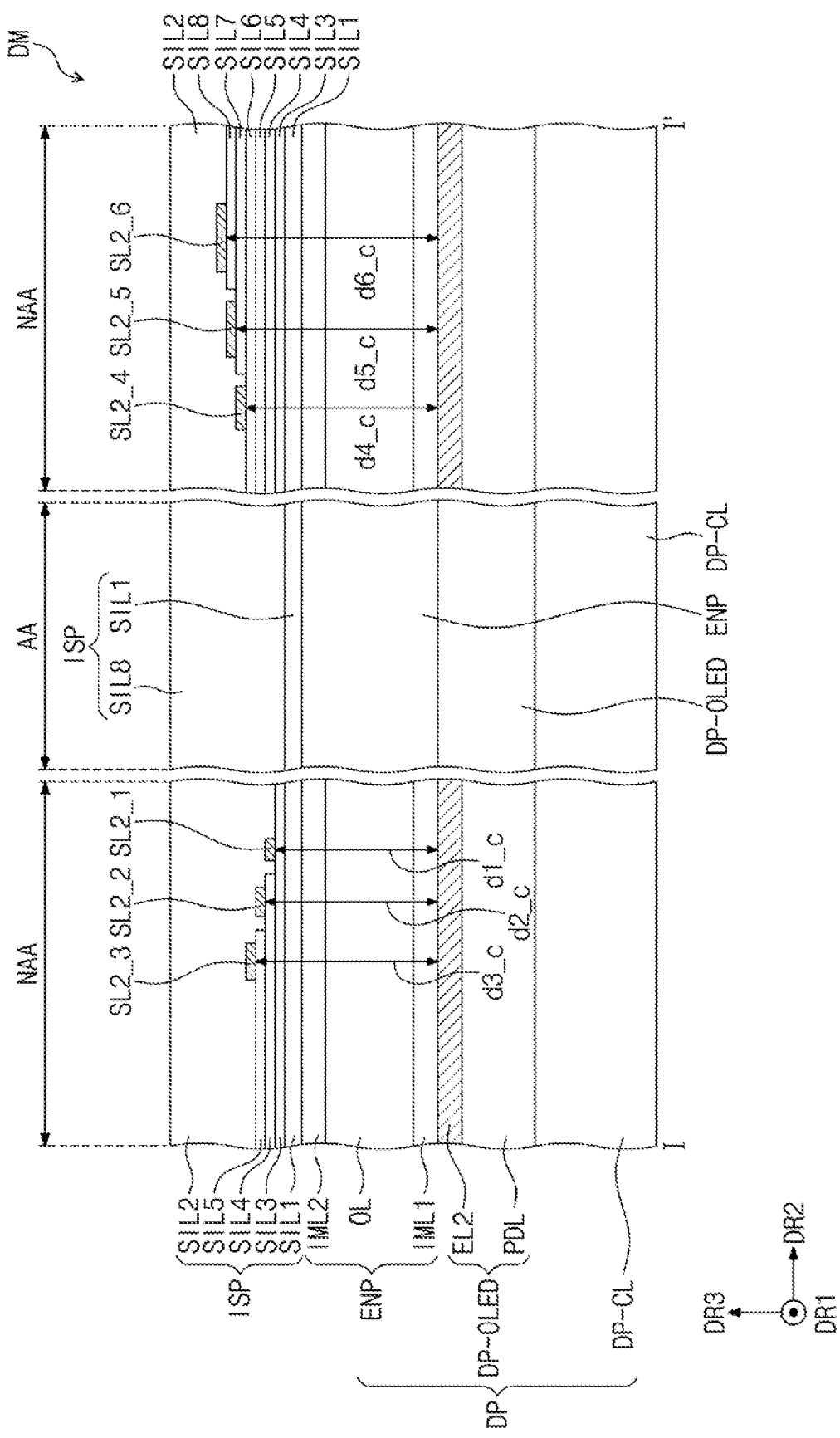

FIGS. 8 and 9 are cross-sectional views showing display modules DM taken along a line I-I' shown in FIG. 4 to explain a relation between a signal line and a sensing insulating layer of an input sensing layer ISP.

Hereinafter, in FIGS. 8 and 9, the same reference numerals denote the same element in FIGS. 4 to 7, and thus, detailed descriptions of the same elements will be omitted for convenience of explanation.

Referring to FIG. 8, a portion of a first sensing insulating layer SIL1, which is disposed in the peripheral area NAA where first, second, and third reception trace lines SL2_1, SL2_2, and SL2_3 are disposed, may be referred to as a first sub-sensing insulating layer SIL1_a, and a portion of the first sensing insulating layer SIL1, which is disposed in the peripheral area NAA where fourth, fifth, and sixth reception trace lines SL2_4, SL2_5, and SL2_6 are disposed, may be referred to as a second sub-sensing insulating layer SIL1_b.

A portion of the first sub-sensing insulating layer SIL1_a, which corresponds to (e.g., overlaps in the third direction DR3) the first reception trace line SL2_1, may be referred to as a first insulating portion IL1_a1, a portion of the first sub-sensing insulating layer SIL1_a, which corresponds to (e.g., overlaps in the third direction DR3) the second reception trace line SL2_2, may be referred to as a second insulating portion IL1_a2, and a portion of the first sub-sensing insulating layer SIL1_a, which corresponds to (e.g., overlaps in the third direction DR3) the third reception trace line SL2_3, may be referred to as a third insulating portion IL1_a3.

A portion of the second sub-sensing insulating layer SIL1_b, which corresponds to (e.g., overlaps in the third direction DR3) the fourth reception trace line SL2_4, may be referred to as a fourth insulating portion IL1_b1, a portion of the second sub-sensing insulating layer SIL1_b, which corresponds to (e.g., overlaps in the third direction DR3) the fifth reception trace line SL2_5, may be referred to as a fifth insulating portion IL1_b2, and a portion of the second sub-sensing insulating layer SIL1_b, which corresponds to (e.g., overlaps in the third direction DR3) the sixth reception trace line SL2_6, may be referred to as a sixth insulating portion IL1_b3.

For example, an upper surface of the first sub-sensing insulating layer SIL1_a may be formed to have a third angle with respect to an upper surface of the first sensing insulating layer SIL1 included in an active area AA. An upper surface of the second sub-sensing insulating layer SIL1_b may be formed to have a fourth angle with respect to the upper surface of the first sensing insulating layer SIL1 included in the active area AA. In an embodiment, the fourth angle may be greater than the third angle. The upper surface of the organic layer OL in the peripheral area NAA may have the same angle as the upper surface of the organic layer OL in the active area AA unlike the embodiment of FIG. 6. The encapsulation layer ENP may not have insulating layers, such as first to sixth insulating layers IL1 to IL6, disposed thereon unlike the embodiment of FIG. 7.

A thickness of the first insulating portion IL1_a1 may be referred to as a first insulating thickness ITH_a1. A thickness of the second insulating portion IL1_a2 may be referred to as a second insulating thickness ITH_a2. A thickness of the third insulating portion IL1_a3 may be referred to as a third insulating thickness ITH_a3. A thickness of the fourth insulating portion IL1_b1 may be referred to as a fourth insulating thickness ITH_b1. A thickness of the fifth insulating portion IL1_b2 may be referred to as a fifth insulating thickness ITH_b2. A thickness of the sixth insulating portion IL1_b3 may be referred to as a sixth insulating thickness ITH_b3.

The first to sixth insulating thicknesses ITH_a1 to ITH_b3 (e.g., lengths in the third direction DR3) may be different from each other. For example, the second insulating thickness ITH_a2 may be greater than the first insulating thickness ITH_a1. The third insulating thickness ITH_a3 may be greater than the second insulating thickness ITH_a2. The fourth insulating thickness ITH_b1 may be greater than the third insulating thickness ITH_a3. The fifth insulating thickness ITH_b2 may be greater than the fourth insulating thickness ITH_b1. The sixth insulating thickness ITH_b3 may be greater than the fifth insulating thickness ITH_b2.

Since thicknesses of the first and second sub-sensing insulating layers SIL1_a and SIL1_b disposed between the first to sixth reception trace lines SL2_1 to SL2_6 and the second electrode EL2 are different from each other depending on each corresponding reception trace line among the first to sixth reception trace lines SL2_1 to SL2_6, first, second, third, fourth, fifth, and sixth distances d1_b, d2_b, d3_b, d4_b, d5_b, and d6_b may be different from each other. For example, the second distance d2_b may be greater than the first distance d1_b. The third distance d3_b may be greater than the second distance d2_b. The fourth distance d4_b may be greater than the third distance d3_b. The fifth distance d5_b may be greater than the fourth distance d4_b. The sixth distance d6_b may be greater than the fifth distance d5_b.

Referring to FIG. 9, the input sensing layer ISP may further include a third sensing insulating layer SIL3, a fourth sensing insulating layer SIL4, a fifth sensing insulating layer SIL5, a sixth sensing insulating layer SIL6, a seventh sensing insulating layer SIL7, and an eighth sensing insulating layer SIL5. For example, each of the third to eighth sensing insulating layers SIL3 to SIL8 may be an inorganic layer and/or an organic layer and may have a single-layer or multi-layer structure. Hereinafter, each of the third to eighth insulating layers SIL3 to SIL8 will be described as the inorganic layer for convenience of explanation.

The third sensing insulating layer SIL3 may be disposed on a first sensing insulating layer SIL1 (e.g., disposed directly thereon in the third direction DR3) in the peripheral area NAA in which first, second, and third reception trace lines SL2_1, SL2_2, and SL2_3 are disposed. The third sensing insulating layer SIL3 may be disposed to correspond to (e.g., overlap in the third direction DR3) the first to third reception trace lines SL2_1 to SL2_3. Unlike the embodiment of FIG. 8, the upper surface of the first sensing insulating layer SIL1 in the peripheral area NAA may be formed to have the same angle with respect to the upper surface of the first sensing insulating layer SIL1 in the active area AA.

The fourth sensing insulating layer SIL4 may be disposed on the third sensing insulating layer SIL3 (e.g., disposed directly thereon in the third direction DR3). The fourth sensing insulating layer SIL4 may be disposed to correspond to (e.g., overlap in the third direction DR3) the second and third reception trace lines SL2_2 and SL2_3.

The fifth sensing insulating layer SIL5 may be disposed on the fourth sensing insulating layer SIL4 (e.g., disposed directly thereon in the third direction DR3). The fifth sensing insulating layer SIL5 may be disposed to correspond to (e.g., overlap in the third direction DR3) the third reception trace line SL2_3.

A second sensing insulating layer SIL2 may be disposed on the first to third reception trace lines SL2_1 to SL2_3. For example, the second sensing insulating layer SIL2 may cover an upper surface and lateral side surfaces of the first to third reception trace lines SL2_1 to SL2_3.

The first sensing insulating layer SIL1 and the third to fifth sensing insulating layers SIL3 to SIL5 may be disposed on a second inorganic layer IML2 in the peripheral area NAA in which fourth to sixth reception trace lines SL2_4 to SL2_6 are disposed.

The sixth sensing insulating layer SIL6 may be disposed on the fifth sensing insulating layer SIL5 (e.g., disposed directly thereon in the third direction DR3). The sixth sensing insulating layer SIL6 may be disposed to correspond to (e.g., overlap in the third direction DR3) the fourth, fifth, and sixth reception trace lines SL2_4, SL2_5, and SL2_6.

The seventh sensing insulating layer SIL7 may be disposed on the sixth sensing insulating layer SIL6 (e.g., disposed directly thereon in the third direction DR3). The seventh sensing insulating layer SIL7 may be disposed to correspond to (e.g., overlap in the third direction DR3) the fifth and sixth reception trace lines SL2_5 and SL2_6.

The eighth sensing insulating layer SIL8 may be disposed on the seventh sensing insulating layer SIL7 (e.g., disposed directly thereon in the third direction DR3). The eighth sensing insulating layer SIL8 may be disposed to correspond to (e.g., overlap in the third direction DR3) the sixth reception trace line SL2_6.

The second sensing insulating layer SIL2 may be disposed on the fourth to sixth reception trace lines SL2_4 to SL2_6. For example, the second sensing insulating layer SIL2 may cover an upper surface and lateral side surfaces of the fourth to sixth reception trace lines SL2_4 to SL2_6.

Since arrangements of the first sensing insulating layer SIL1 and the third to eighth sensing insulating layers SIL3 to SIL8 disposed between the first to sixth reception trace lines SL2_1 to SL2_6 and a second electrode EU are different from each other, steps may be formed between adjacent reception trace lines and first, second, third, fourth, fifth, and sixth distances $d1\_c$, $d2\_c$, $d3\_c$, $d4\_c$, $d5\_c$, and $d6\_c$ (e.g., lengths in the third direction DR3) may be different from each other. For example, the second distance $d2\_c$ may be greater than the first distance $d1\_c$. The third distance $d3\_c$ may be greater than the second distance $d2\_c$. The fourth distance $d4\_c$ may be greater than the third distance $d3\_c$. The fifth distance $d5\_c$ may be greater than the fourth distance $d4\_c$. The sixth distance $d6\_c$ may be greater than the fifth distance $d5\_c$.

Figure 10:
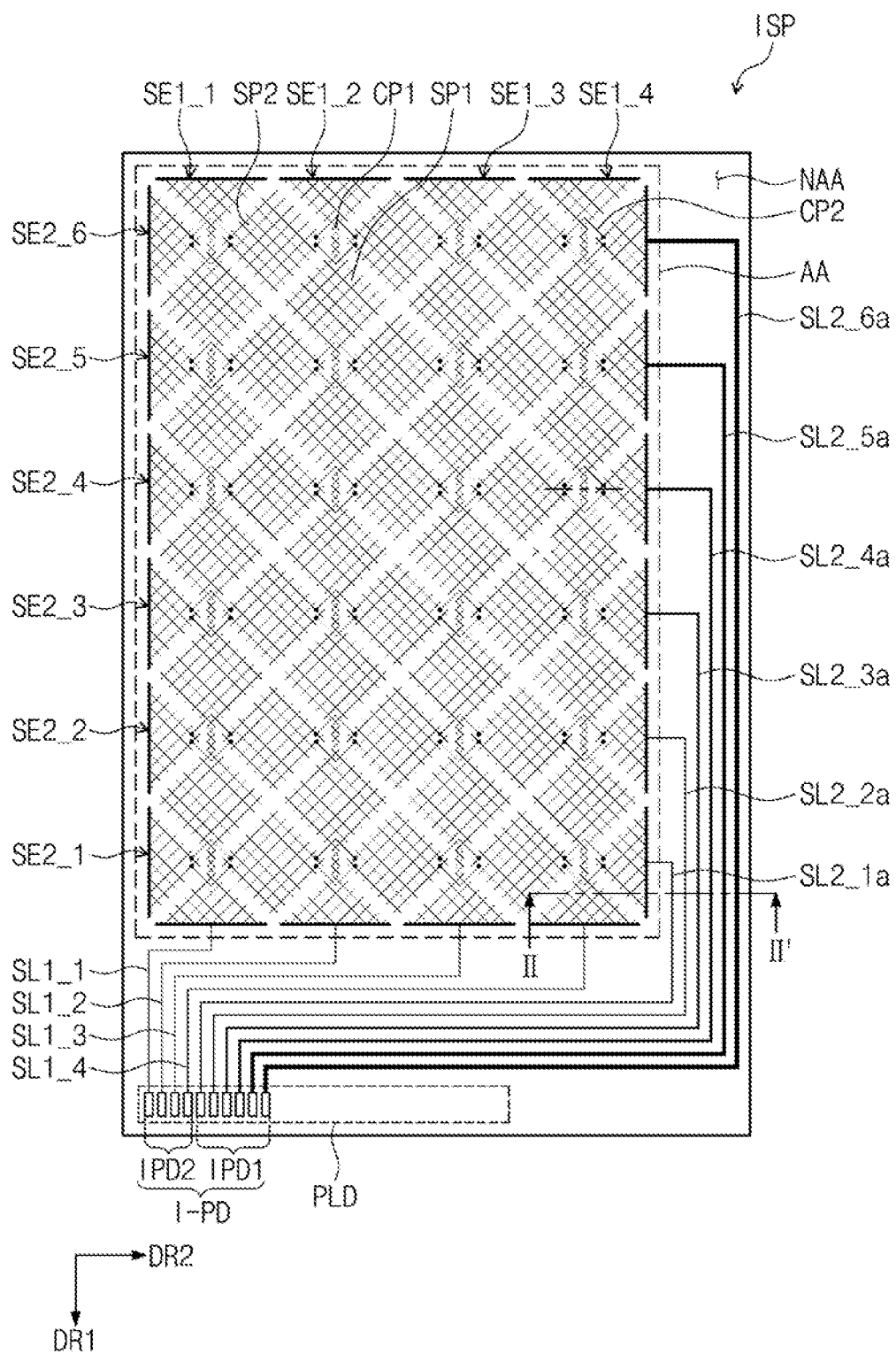
FIG. 10 is a plan view showing an input sensing layer according to an embodiment of the present inventive concept.
Figure 11:
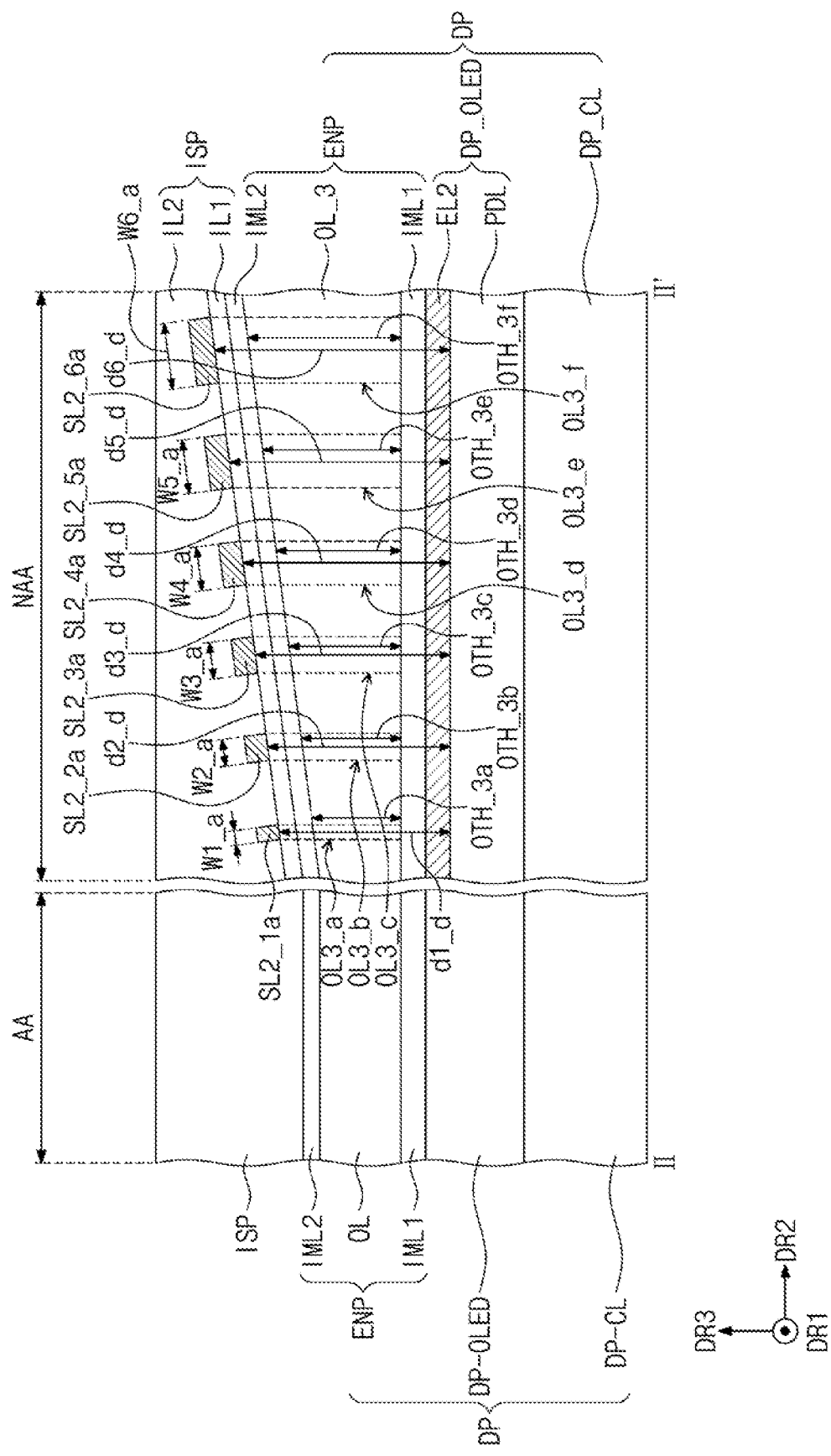
FIG. 11 is a cross-sectional view showing a display module taken along a line II-II' of FIG. 10 according to an embodiment of the present inventive concept.

FIG. 10 is a plan view showing an input sensing layer ISP according to an embodiment of the present inventive concept, and FIG. 11 is a cross-sectional view showing a display module DM taken along a line II-II' shown in FIG. 10 to explain a relation between a signal line and an encapsulation layer ENP. In FIGS. 10 and 11, the same reference numerals denote the same elements in FIGS. 4 to 6, and thus, detailed descriptions of the same elements will be omitted for convenience of explanation.

Referring to FIGS. 10 and 11, first to sixth reception trace lines SL2_1a to SL2_6a may be disposed in a peripheral area NAA to be adjacent to one side of an active area AA, such as the right side of the active area AA in the second direction DR2. However, embodiments of the present inventive concept are not limited thereto.

The first to sixth reception trace lines SL2_1a to SL2_6a may have different lengths from each other. For example, a first reception electrode SE2_1 may be disposed nearest to input pads I-PD, and second to sixth reception electrodes SE2_2 to SE2_6 may be spaced apart from each other while being sequentially arranged in a direction opposite to the first direction DR1 with respect to the first reception electrode SE2_1. Accordingly, among the first to sixth reception trace lines SL2_1a to SL2_6a, the first reception trace line SL2_1a may have the smallest length, and the sixth reception trace line SL2_6a may have the largest length.

Widths $W1\_a$ to $W6\_a$ of the first to sixth reception trace lines may be set to be different from each other to compensate for difference in lengths of the first to sixth reception trace lines SL2_1a to SL2_6a. For example, among the first to sixth reception trace lines SL2_1a to SL2_6a, the first reception trace line SL2_1a with the smallest length may have the smallest width $W1\_a$, and the sixth reception trace line SL2_6a with the largest length may have the largest width $W6\_a$.

For example, in an embodiment, distances between each of the first to sixth reception trace lines SL2_1a to SL2_6a and an second electrode EL2 may be set to be different from each other by controlling a thickness of the encapsulation layer ENP disposed between the first to sixth reception trace lines SL2_1a to SL2_6a and the electrode layer.

A portion of an organic layer OL, which is disposed in the peripheral area NAA where the first to sixth reception trace lines SL2_1a to SL2_6a are disposed may be referred to as a third organic layer OL_3.

A portion of the third organic layer OL_3, which corresponds to (e.g., overlaps in the third direction DR3) the first reception trace line SL2_1a, may be referred to as a first encapsulation portion OL_3a, a portion of the third organic layer OL_3, which corresponds to (e.g., overlaps in the third direction DR3) the second reception trace line SL2_2a, may be referred to as a second encapsulation portion OL_3b, a portion of the third organic layer OL_3, which corresponds to (e.g., overlaps in the third direction DR3) the third reception trace line SL2_3a, may be referred to as a third encapsulation portion OL_3c, a portion of the third organic layer OL_3, which corresponds to (e.g., overlaps in the third direction DR3) the fourth reception trace line SL2_4a, may be referred to as a fourth encapsulation portion OL_3d, a portion of the third organic layer OL_3, which corresponds to (e.g., overlaps in the third direction DR3) the fifth reception trace line SL2_5a, may be referred to as a fifth encapsulation portion OL_1e, and a portion of the third organic layer OL_3, which corresponds to (e.g., overlaps in the third direction DR3) the sixth reception trace line SL2_6a, may be referred to as a sixth encapsulation portion OL_3f.

The first to sixth encapsulation portions OL_3a to OL_3f may be referred to as first to sixth organic layer portions OL_3a to OL_3f.

For example, an upper surface of the third organic layer OL_3 may be formed to have a fifth angle with respect to an upper surface of the organic layer OL included in the active area AA.

A thickness of the first encapsulation portion OL_3a may be referred to as a first encapsulation thickness OTH_3a. A thickness of the second encapsulation portion OL_3b may be referred to as a second encapsulation thickness OTH_3b. A thickness of the third encapsulation portion OL_3c may be referred to as a third encapsulation thickness OTH_3c. A thickness of the fourth encapsulation portion OL_3d may be referred to as a fourth encapsulation thickness OTH_3d. A thickness of the fifth encapsulation portion OL_3e may be referred to as a fifth encapsulation thickness OTH_3e. A thickness of the sixth encapsulation portion OL_3f may be referred to as a sixth encapsulation thickness OTH_3f.

The first to sixth encapsulation thicknesses OTH_3a to OTH_3f (e.g., lengths in the third direction DR3) may be different from each other. For example, in an embodiment, the second encapsulation thickness OTH_3b may be greater than the first encapsulation thickness OTH_3a. The third encapsulation thickness OTH_3c may be greater than the second encapsulation thickness OTH_3b. The fourth encapsulation thickness OTH_3d may be greater than the third encapsulation thickness OTH_3c. The fifth encapsulation thickness OTH_3e may be greater than the fourth encapsulation thickness OTH_3d. The sixth encapsulation thickness OTH_3f may be greater than the fifth encapsulation thickness OTH_3e.

A distance between the first reception trace line SL2_1a and a second electrode EL2 may be referred to as a first distance d1_d, a distance between the second reception trace line SL2_2a and the second electrode EL2 may be referred to as a second distance d2_d, a distance between the third reception trace line SL2_3a and the second electrode EL2 may be referred to as a third distance d3_d, a distance between the fourth reception trace line SL2_4a and the second electrode EL2 may be referred to as a fourth distance d4_d, a distance between the fifth reception trace line SL2_5a and the second electrode EL2 may be referred to as a fifth distance d5_d, and a distance between the sixth reception trace line SL2_6a and the second electrode EL2 may be referred to as a sixth distance d6_d.

The thickness of the organic layer OL3 disposed between the first to sixth reception trace lines SL2_1a to SL2_6a and the second electrode EL2 may vary depending on each corresponding reception trace line among the first to sixth reception trace lines SL2_1a to SL2_6a, and thus, the first to sixth distances d1_d to d6_d may be different from each other.

For example, in an embodiment, the second distance d2_d may be greater than the first distance d1_d. The third distance d3_d may be greater than the second distance d2_d. The fourth distance d4_d may be greater than the third distance d3_d. The fifth distance d5_d may be greater than the fourth distance d4_d. The sixth distance d6_d may be greater than the fifth distance d5_d. Accordingly, as an example, although the width W6_a of the sixth reception trace line is greater than the width W1_a of the first reception trace line, a capacitance between the sixth reception trace line SL2_6a and the second electrode EL2 may be substantially the same as a capacitance between the first reception trace line SL2_1a and the second electrode EL2. Consequently, even though the first to sixth reception trace lines SL2_1a to SL2_6a are disposed in one side of the peripheral area NAA, the difference in delay value of the signals having information about the external input that is transmitted through the first to sixth reception trace lines SL2_1a to SL2_6a, which is caused by the resistance of each of the trace lines SL2_1a to SL2_6a and the capacitance between each of the trace lines SL2_1a to SL2_6a and the second electrode EL2 may be prevented from occurring.

Referring to FIG. 10, the input pads I-PD may include first input pads IPD1 connected to first to fourth transmission trace lines SL1_1 to SL1_4 and second input pads IPD2 connected to the first to sixth reception trace lines SL2_1a to SL2_6a.

Although embodiments of the present inventive concept have been described, it is understood that the present inventive concept should not be limited to these embodiments but various changes and modifications can be made by one ordinary skilled in the art within the spirit and scope of the present inventive concept as hereinafter claimed.

Therefore, the disclosed subject matter should not be limited to any single embodiment described herein.

What is claimed is:

1. A display device comprising:
a display panel configured to display an image, the display panel including an electrode layer and a display element layer including a light emitting element;
an encapsulation layer disposed on the display element layer, a first portion of the encapsulation layer has an upper surface that inclines towards an edge of the display device; and
an input sensing layer disposed on the display panel, the input sensing layer comprising:
a plurality of sensing electrodes including a first sensing electrode and a second sensing electrode; and
a plurality of signal lines electrically connected to the plurality of sensing electrodes and overlapping the first portion of the encapsulation layer, the plurality of signal lines includes a first signal line electrically connected to the first sensing electrode and a second signal line electrically connected to the second sensing electrode,
wherein an entirety of the first signal line has a length greater than a length of an entirety of the second signal line, and
wherein a distance between the first signal line and the electrode layer is greater than a distance between the second signal line and the electrode layer.

2. The display device of claim 1, wherein the first signal line has a width greater than a width of the second signal line.

3. The display device of claim 1, wherein:
the first sensing electrode and the second sensing electrode are spaced apart from each other in a first direction;
the first signal line includes a first line portion extending in the first direction and a second line portion extending in a second direction crossing the first direction; and
the second signal line comprises a third line portion extending in the first direction and a fourth line portion extending in the second direction.

4. The display device of claim 3, wherein;
a length of the first line portion is greater than a length of the third line portion; and
a distance between the first line portion and the electrode layer is greater than a distance between the third line portion and the electrode layer.

5. The display device of claim 1,
wherein the light emitting element comprises:
a first electrode;
a light emitting layer disposed on the first electrode; and
a second electrode disposed on the light emitting layer.

6. The display device of claim 5, wherein the electrode layer comprises the second electrode, and a distance between the first signal line and the second electrode is different from a distance between the second signal line and the second electrode.

7. The display device of claim 6, wherein:
a distance between the first signal line and the second electrode is greater than a distance between the second signal line and the second electrode.

8. The display device of claim 5, wherein:
the encapsulation layer comprises a first encapsulation portion corresponding to the first signal line and a second encapsulation portion corresponding to the second signal line; and
the first encapsulation portion has a thickness different from a thickness of the second encapsulation portion.

9. The display device of claim 8, wherein:
the thickness of the first encapsulation portion is greater than the thickness of the second encapsulation portion.

10. The display device of claim 9, wherein the encapsulation layer comprises:
a first inorganic layer disposed on the display element layer;
a second inorganic layer disposed on the first inorganic layer; and
an organic layer disposed between the first and second inorganic layers.

11. The display device of claim 10, wherein:
the organic layer comprises a first organic layer portion corresponding to the first signal line and a second organic layer portion corresponding to the second signal line; and
the first organic layer portion has a thickness greater than a thickness of the second organic layer portion.

12. The display device of claim 9, wherein:
the first sensing electrode and the second sensing electrode are spaced apart from each other in a first direction;
the first signal line includes a first line portion extending in the first direction and a second line portion extending in a second direction crossing the first direction; and
the second signal line comprises a third line portion extending in the first direction and a fourth line portion extending in the second direction.

13. The display device of claim 12, wherein:
the encapsulation layer includes a third encapsulation portion corresponding to the first line portion and a fourth encapsulation portion corresponding to the third line portion;
the first line portion has a length greater than a length of the third line portion; and
a thickness of the third encapsulation portion is greater than a thickness of the fourth encapsulation portion.

14. The display device of claim 5, wherein:
the encapsulation layer further comprises:
a first inorganic layer disposed on the display element layer;
a second inorganic layer disposed on the first inorganic layer;
an organic layer disposed between the first and second inorganic layers;
a first insulating layer disposed on the second inorganic layer and corresponding to the first and second signal lines; and
a second insulating layer disposed on the first insulating layer and corresponding to the first signal line.

15. The display device of claim 1, wherein the input sensing layer comprises:

a sensing insulating layer disposed on the display panel; and
a conductive layer disposed on the sensing insulating layer, the conductive layer including the plurality of sensing electrodes and the plurality of signal lines,
wherein the sensing insulating layer includes a first insulating portion corresponding to the first signal line and a second insulating portion corresponding to the second signal line, and
wherein the first insulating portion has a thickness different from a thickness of the second insulating portion.

16. The display device of claim 15, wherein:
the thickness of the first insulating portion is greater than the thickness of the second insulating portion.

17. The display device of claim 16, wherein:
the first sensing electrode and the second sensing electrode are spaced apart from each other in a first direction;
the first signal line includes a first line portion extending in the first direction and a second line portion extending in a second direction crossing the first direction; and
the second signal line comprises a third line portion extending in the first direction and a fourth line portion extending in the second direction.

18. The display device of claim 17, wherein:
the sensing insulating layer includes a third insulation portion corresponding to the first line portion and a fourth insulation portion corresponding to the third line portion;
the first line portion has a length greater than a length of the third line portion; and
a thickness of the third insulating portion is greater than a thickness of the fourth insulating portion.

19. The display device of claim 15, wherein the sensing insulating layer comprises an organic material.

20. A display device comprising:
a display panel configured to display an image, the display panel including an electrode layer and a display element layer including a light emitting element;
an encapsulation layer disposed on the display element layer, a first portion of the encapsulation layer has an upper surface that inclines towards an edge of the display device; and
an input sensing layer disposed on the display panel and configured to sense an input, the input sensing layer comprising a plurality of sensing electrodes and a plurality of signal lines electrically connected to the plurality of sensing electrodes, respectively, the plurality of signal lines overlapping the first portion of the encapsulation layer;
wherein an entirety of each of the plurality of signal lines has a length and a width different from an entirety of a length and a width of other signal lines of the plurality of signal lines, each of the plurality of signal lines having a substantially same resistance as each other,
wherein each of the plurality of signal lines has a distance to the electrode layer that is different from other signal lines of the plurality of signal lines,
wherein each of the plurality of signal lines has a substantially same capacitance with the electrode layer,
wherein the distance to the electrode layer of each of the plurality of signal lines increases as the length of the entirety of each of the plurality of signal lines increases.

21. The display device of claim 20, wherein:
the plurality of sensing electrodes includes 1st to n sensing electrodes, wherein n is a natural number greater than or equal to 2;

the plurality of signal lines including 1st to n signal lines electrically connected to the $1^{st}$ to n sensing electrodes, respectively;
a length and a width of the $1^{st}$ to n signal lines increase from the $1^{st}$ signal line to the n signal line; and
the distance of the $1^{st}$ to n signal lines to the electrode layer increases from the $1^{st}$ signal line to the n signal line.

* * * * *